United States Patent
Kawakami et al.

(10) Patent No.: US 6,270,880 B1
(45) Date of Patent: Aug. 7, 2001

(54) CRYSTALLINE GLASS COMPOSITION FOR USE IN CIRCUIT BOARD, SINTERED CRYSTALLINE GLASS, INSULATOR COMPOSITION INSULATING PASTE AND THICK FILM CIRCUIT BOARD

(75) Inventors: Hiromichi Kawakami; Hirofumi Sunahara, both of Moriyama; Toshiki Tanaka, Otsu; Shizuharu Watanabe, Omihachiman; Hiroshi Takagi, Otsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/418,926

(22) Filed: Oct. 15, 1999

(30) Foreign Application Priority Data

Oct. 16, 1998 (JP) .................................. 10-295100
Oct. 16, 1998 (JP) .................................. 10-295101
Dec. 17, 1998 (JP) .................................. 10-358768

(51) Int. Cl.[7] .............................. B32B 3/00; C03C 10/04
(52) U.S. Cl. .................................. 428/210; 501/5; 501/32
(58) Field of Search ........................... 501/5, 32; 428/210

(56) References Cited

U.S. PATENT DOCUMENTS

| | | | |
|---|---|---|---|
| 4,301,324 | * 11/1981 | Kumar et al. | 174/68.5 |
| 4,490,429 | * 12/1984 | Tosaki et al. | 428/195 |
| 4,749,665 | * 6/1988 | Yano et al. | 501/32 |
| 4,963,517 | * 10/1990 | Goto et al. | 501/122 |
| 5,304,518 | * 4/1994 | Sunahara et al. | 501/62 |
| 5,763,059 | * 6/1998 | Yamaguchi et al. | 428/209 |

FOREIGN PATENT DOCUMENTS 3-4594   1/1991   (JP) .

* cited by examiner

Primary Examiner—Cathy Lam
(74) Attorney, Agent, or Firm—Ostrolenk, Faber, Gerb & Soffen, LLP

(57) ABSTRACT

Provided is a crystalline glass composition for use in a circuit board that can be sintered at a temperature of 1100° C. and is endowed with favorable characteristics such as a relative dielectric constant of as low as ½ and a thermal expansion coefficient of as high as 12 ppm/° C. as an electrical insulating insulator for use in a circuit board. The crystalline glass composition contains $SiO_2$, MgO and CaO, the composition ratio of $SiO_2$, MgO and CaO in % by weight falling within an area surrounded by the lines connecting the points A (25, 45, 30), B (25, 0, 75), C (44, 0, 56), D (44, 22, 34), E (40, 19, 41) and F (29, 40, 31) in a ternary phase diagram wherein at least one melwinite, monticellite or calcium silicate crystalline phase is deposited by heat-treating the composition. A ceramic powder having a thermal expansion coefficient of about 6.0 ppm/C or more is sometimes added in the powder comprising the glass composition.

23 Claims, 2 Drawing Sheets

CRYSTALLINE GLASS COMPOSITION FOR USE IN CIRCUIT BOARD, SINTERED CRYSTALLINE GLASS, INSULATOR COMPOSITION INSULATING PASTE AND THICK FILM CIRCUIT BOARD

BACKGROUND OF THE INVENTION

1. Field of the Invention

The present invention relates to a crystalline glass composition for use as an electrical insulator in a circuit board such as a multilayer circuit board, a sintered crystalline glass obtained by firing the crystalline glass composition, an insulator composition containing a crystalline glass powder comprising the crystalline glass composition and a ceramic powder, an insulating paste prepared by mixing the insulator composition and an organic vehicle and a thick film circuit board having an insulating layer obtained by firing the insulating paste.

More specifically, the present invention relates to an improved method for allowing the crystalline glass composition or the insulating paste to be sintered at a low temperature while endowing the sintered crystalline glass or insulating layer obtained by firing them with a low dielectric constant and a high thermal expansion coefficient.

2. Description of the Related Art

Miniaturization and high integration of various kinds of electronic appliances have been aggressively advanced in recent years as a result of developments in semiconductor elements for integrated circuits such as ICs and LSIs. Consequently, miniaturization and high integration are also required for circuit boards for mounting the semiconductor elements for the integrated circuits, forcing the electrical wiring of the circuit board to be fine and multilayered.

It is known that signals propagating in a conductor are usually more delayed when materials surrounding the conductor have higher dielectric constants. Therefore, the electrical insulator material for high speed propagation is required to have a low dielectric constant.

However, since the thermal expansion coefficient of the low dielectric constant insulator is in general smaller than thermal expansion coefficient of conductors for use, for example, in electrodes, it is a problem that deformation and cracks are generated due to differences in the thermal expansion coefficients when various materials are integrated into multilayers.

In relation to the problem described above, Japanese Unexamined Patent Publication No. 3-4594 proposes to construct an insulating layer having a larger thermal expansion coefficient by using principal components of MgO, $SiO_2$ and CaO in a specified composition ratio in order to manufacture a capacitor-integration type composite circuit board in which a dielectric layer having a large thermal expansion coefficient is integrated by inserting it between insulating layers, thereby increasing the thermal expansion coefficient of the insulating layer. A principal crystalline phase forsterite ($Mg_2SiO_4$) is deposited by calcining at a temperature of 1000° C. to 1300° C. followed by firing at a temperature of 1240° C. to 1340° C. in the insulating layer is disclosed in this publication to increase the thermal expansion coefficient.

However, sintering at a temperature of 1100° C. or less is impossible in the electrical insulators constituting the insulating layers described in the publication above. Therefore, the materials cannot be used for the electrical insulators for the circuit boards in which conductors containing, for example, silver are formed on the surface or inside of them.

Since merwinite ($Ca_3MgSi_2O_8$), monticellite ($CaMgSiO_4$) and calcium silicate (at least one of $CaSiO_3$, $Ca_3Si_2O_7$, $Ca_2SiO_4$ and $Ca_3SiO_5$) are known to be crystalline phases having larger thermal-expansion coefficients than forsterite ($Mg_2SiO_4$), the electrical insulators for the insulating layers described in the foregoing publication seem to fall within a composition region where relatively a small amount of these crystalline phases are deposited.

SUMMARY OF THE INVENTION

Accordingly, the object of the present invention is to provide a crystalline glass composition for use in a circuit board in which at least one kind of the crystalline phase among merwinite ($Ca_3MgSi_2O_8$), monticellite ($CaMgSiO_4$) and calcium silicate (at least one of $CaSiO_3$, $Ca_3Si_2O_7$, $Ca_2SiO_4$ and $Ca_3SiO_5$), which can be fired at a temperature of 1100° C. or less besides having a larger thermal expansion coefficient than forsterite ($Mg_2SiO_4$), are allowed to be efficiently deposited at a low temperature of 1100° C. or less, thus obtaining an electrical insulator for use in a circuit board having a relative dielectric constant of as low as 12 or less and a thermal expansion coefficient of as high as 10 ppm/° C., and a sintered crystalline glass obtained by firing the crystalline glass composition.

Another object of the present invention is to provide an insulator composition containing the crystalline glass composition described above and a ceramic power, an insulating paste prepared by mixing the insulator composition with an organic vehicle, and a thick film circuit board obtained by firing the insulating paste. More specifically, the object of the present invention is to provide an insulator composition and insulating paste that can be sintered at a temperature of 1100° C. or less while allowing at least one kind of the crystalline phase among merwinite ($Ca_3MgSiO_8$), monticellite ($CaMgSiO_4$) and calcium silicate (at least one of $CaSiO_3$, $Ca_3Si_2O_7$, $Ca_2SiO_4$ and $Ca_3SiO_5$) to be efficiently deposited at a low temperature of 1100° C. or less as described above, thereby providing an electrical insulator for use in a circuit board having a relative dielectric constant of as low as 10 or less and a thermal expansion coefficient of as high as 8 ppm/° C. after firing, and to provide a thick film circuit board having an insulating layer obtained by firing the insulating paste.

In one first aspect, the present invention provides a crystalline glass composition for use in a circuit board containing $SiO_2$, MgO and CaO, the composition ratio of $SiO_2$, MgO and CaO represented by % by weight falling within an area surrounded by the lines connecting the points A (25, 45, 30), B (25, 0, 75), C (44, 0, 56), D (44, 22, 34), E (40, 19, 41) and F (29, 40, 31) in a ternary phase diagram, wherein at least one crystalline phase of merwinite, monticellite and calcium silicate are deposited by heat-treating the composition.

The present invention also provides a crystalline glass composition for use in a circuit board in which the composition ratio of $SiO_2$, MgO and CaO represented by % by weight% falling within an area surrounded by the lines connecting the points G (30, 19, 51), H (30, 5, 65), I (44, 5, 51), and J (44, 19, 37) in a ternary phase diagram, wherein at least one crystalline phase among merwinite, monticellite and calcium silicate are deposited by heat-treating the composition.

In another aspect, the present invention provides a crystalline glass composition for use in a circuit board containing principal components of $SiO_2$, MgO and CaO while containing sub-components of at least one of (1) $Al_2O_3$, (2)

at least one of BaO and SrO, and ZnO, (3) at least one of Li$_2$O, Na$_2$O and K$_2$O, and (4) B$_2$O$_3$, the composition ratio of SiO$_2$, MgO and CaO in the principal component represented by % by weight falling within an area surrounded by the lines connecting the points A (25, 70, 5), B (25, 0, 75), C (44, 0, 56) and D (44, 51, 5) in a ternary phase diagram, wherein the sub-component is contained in a combined proportion of about 0.5 to 50 parts by weight relative to 100 parts by weight of the principal component while containing sub-components of (1) about 0.5 to 25 parts by weight of Al$_2$O$_3$, if any, (2) about 0.5 to 10 parts by weight of at least one of BaO and SrO and ZnO, if any, (3) about 0.5 to 5 parts by weight of at least one of Li$_2$O, Na$_2$O and K$_2$O, if any, and (4) about 0.5 to 25 parts by weight of B$_2$O$_3$, if any, at least one crystalline phase among merwinite, monticellite and calcium silicate being made to deposit by heat-treating the composition. With this composition, the sintering temperature can be reduced further.

The crystalline glass composition for use in a circuit board as just described above is selected so that the composition ratio of the principal components of SiO$_2$, MgO and CaO represented by % by weight preferably falls within an area surrounded by the lines connecting the points E (25, 45, 30), B (25, 0, 75), C (44, 0, 56), F (44, 22, 34), G (40, 19, 41) and H (29, 40, 31) in the ternary phase diagram shown in FIG. 1.

It is more preferable that the composition ratio of principal components of SiO$_2$, MgO and CaO represented by % by weight falls within an area surrounded by the lines connecting the points I (30, 19, 51), J (30, 5, 65), K (44, 5, 51) and L (44, 19, 37) in the ternary phase diagram shown in FIG. 1.

DETAILED DESCRIPTION OF EMBODIMENTS OF THE INVENTION

Figure 1:
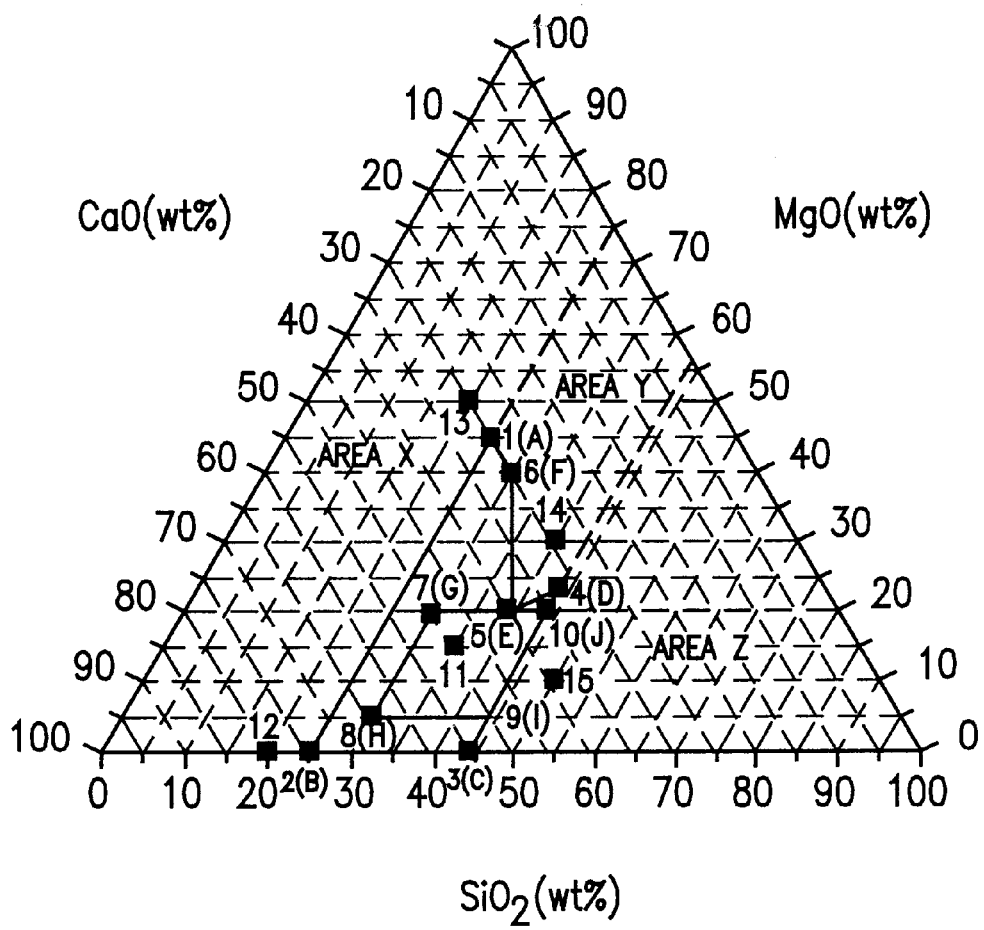
FIG. 1 shows a ternary phase diagram indicating the composition ranges of SiO$_2$, MgO and CaO contained in the crystalline glass composition for use in a circuit board according to the present invention.

The crystalline glass composition as described above can be usually obtained by melting and then quenching raw materials for manufacturing the composition.

While the specified crystalline phases described are usually deposited after a heat treatment, a part of the phases may have been already deposited prior to the heat treatment. Crystalline phases other than these specified phases may be contained in the composition, which may be deposited before the heat treatment or a part of which may have been already deposited prior to the heat treatment as well.

As long as merwinite, monticellite and/or calcium silicate are detectable in the glass, it can be employed in the present invention. Preferably, at least about 30% of the glass is a such crystalline phase. When other crystalline phases are also present, the merwinite, monticellite and/or calcium silicate will be the principal crystalline material, i.e., the largest (weight) present.

The heat treatment for allowing the specified crystalline phases to deposit from the crystalline glass composition is usually applied at a temperature above the crystallization temperature of the composition. The crystallization temperature is about 1100° C. or less, so that the specified crystalline phases can be formed at a relatively low temperature.

The term "crystalline glass" as used herein refers to "a glass having a crystalline phase" and/or "a glass provided with an ability to deposit crystalline phases by heat-treatment".

The present invention is also directed toward a sintered crystalline glass obtained by firing the crystalline glass composition for use in a circuit board.

The sintered glass contains at least one of crystalline phase among merwinite (Ca$_3$MgSi$_2$O$_8$), monticellite (CaMgSiO$_4$) and calcium silicate (i.e., at least one of CaSiO$_3$, Ca$_3$Si$_2$O$_7$, Ca$_2$SiO$_4$ and Ca$_3$SiO$_5$).

The sintered crystalline glass obtained by firing the latter preferable crystalline glass composition described above contains the crystalline phases of all of merwinite, monticellite and calcium silicate.

The present invention is also directed toward an insulator composition containing a crystalline glass powder comprising the crystalline glass composition as described above and a ceramic powder. The ceramic powder has a thermal expansion coefficient of about 6.0 ppm/° C. or more in the insulator composition according to the present invention.

The insulator composition as described above preferably contains about 50% by weight or more of the crystalline glass powder.

The ceramic powder in the insulator composition comprises at least one kind of a ceramic powder such as alumina, forsterite, spinel, quartz, diopside, merwinite, monticellite, steatite, enstatite and calcium silicate.

The present invention is also directed toward an insulating paste prepared by mixing the insulator composition as described above and an organic vehicle.

The present invention also directed toward a thick film circuit board having an insulating layer obtained by firing the insulating paste as described above.

EXAMPLE 1

Example 1 relates to a crystalline glass composition and sintered glass composition.

SiO$_2$, MgCO$_3$ and CaCO$_3$ were prepared as starting materials of the glass component. After mixing them to be a glass composition (% by weight) shown in TABLE 1, the mixture was melted at a temperature of 1500 to 1750° C. to prepare a fused glass. The fused glass was then quenched by placing it into water, obtaining a glass powder.

TABLE 1

| Sample No. | Glass Composition | | | Reference Mark in Ternary Phase Diagram |
|---|---|---|---|---|
| | SiO$_2$ | MgO | CaO | |
| 1 | 25 | 45 | 30 | A |
| 2 | 25 | 0 | 75 | B |
| 3 | 44 | 0 | 56 | C |
| 4 | 44 | 22 | 34 | D |
| 5 | 40 | 19 | 41 | E |

TABLE 1-continued

| Sample | Glass Composition | | | Reference Mark in Ternary |
|---|---|---|---|---|
| No. | SiO$_2$ | MgO | CaO | Phase Diagram |
| 6 | 29 | 40 | 31 | F |
| 7 | 30 | 19 | 51 | G |
| 8 | 30 | 5 | 65 | H |
| 9 | 44 | 5 | 51 | I |
| 10 | 44 | 19 | 37 | J |
| 11 | 35 | 15 | 50 | — |
| *12 | 20 | 0 | 80 | — |
| *13 | 20 | 50 | 30 | — |
| *14 | 40 | 30 | 30 | — |
| *15 | 50 | 10 | 40 | — |

The composition of the glass component of each sample shown in TABLE 1 is plotted in the ternary phase diagram in FIG. 1. Each reference numeral 1 to 15 correspond to each sample No. in TABLE 1.

A slurry in which the glass powder was uniformly dispersed was prepared by mixing an organic solvent and toluene as a solvent with the glass powder, followed by thoroughly kneading in a ball mill. The slurry was defoamed under a reduced pressure.

A green sheet with a thickness of 0.2 mm was obtained from the slurry obtained as described above on a film by casting using a doctor blade method. Each green sheet was dried, peeled off from the film, and punched to form a green sheet with a given dimension.

Several sheets of these green sheets were laminated and press-molded to obtain a molded body.

Then the molded body was fired at 1100° C. for two hours with a heating rate of 200° C. per hour, obtaining a sintered crystalline glass.

The relative dielectric constant, insulation resistance, thermal expansion coefficient, capability of firing at a temperature of 1100° C. or less, and crystalline phase were evaluated with respect to these sintered crystalline glasses.

A sample with a dimension of 10 mm×10 mm×0.5 mm was used for the determination of relative dielectric constant. Electrostatic capacitance was measured with a LCR meter at a frequency of 1 MHZ, a voltage of 1 Vrms and a temperature of 25° C. for calculating relative dielectric constant from the measured electrostatic capacitance.

For the measurement of insulation resistance, the sample with the same dimension as used in the measurement of relative dielectric constant was used, on which a direct voltage of 50 V was impressed to measure the resistance at 60 seconds later.

For the measurement of thermal expansion coefficient, a sample with a dimension of 2 mm×2 mm×10 mm was used, and a mean thermal expansion coefficient in the temperature range of from 30° C. through 400° C. was measured.

The crystalline phase was investigated by X-ray diffraction analysis to identify it by the X-ray diffraction pattern of the surface of the evaluation sample.

The results of evaluation are listed in TABLE 2.

The samples marked by (*) in any Table in this text refer to those with compositions out of the range of the present invention.

TABLE 2

| Sample No. | Relative Dielectric Constant $\epsilon_r$ | Insulation Resistance logIR | Thermal Expansion Coefficient (ppm/° C.) | Capability of Sintering at 1100° C. or Less | Existence of Crystalline Phase; Yes ○, No x | | |
|---|---|---|---|---|---|---|---|
| | | | | | Merwinite | Monticellite | Calcium Silicate |
| 1 | 8.5 | >9 | 13.0 | YES | ○ | ○ | x |
| 2 | 9.0 | >9 | 14.0 | YES | x | x | ○ |
| 3 | 7.5 | >9 | 12.5 | YES | x | x | ○ |
| 4 | 7.0 | >9 | 12.5 | YES | ○ | ○ | x |
| 5 | 7.5 | >9 | 12.5 | YES | ○ | ○ | ○ |
| 6 | 8.0 | >9 | 12.5 | YES | ○ | ○ | x |
| 7 | 8.0 | >11 | 12.5 | YES | ○ | ○ | ○ |
| 8 | 8.5 | >11 | 13.5 | YES | ○ | ○ | ○ |
| 9 | 7.5 | >11 | 13.5 | YES | ○ | ○ | ○ |
| 10 | 7.5 | >11 | 13.0 | YES | ○ | ○ | ○ |
| 11 | 8.0 | >11 | 13.5 | YES | ○ | ○ | ○ |
| *12 | — | <9 | — | NO | — | — | — |
| *13 | — | <9 | — | NO | — | — | — |
| *14 | 7.5 | >9 | 11 | YES | ○ | ○ | — |
| | | | | | Main Phase is Forsterite | | |
| *15 | 6.0 | >9 | 9 | YES | — | — | — |
| | | | | | Main Phase is Diopside | | |

The reason why the composition range of the crystalline glass composition for use in a circuit board according to the present invention will be described hereinafter with reference to TABLE 1, TABLE 2 and FIG. 1.

In the crystalline glass with a composition of xSiO$_2$—yMgO—zCaO (x, y and z are represented by % by weight), sample Nos. 1 to 11 having compositions within the range of the present invention fall within an area surrounded by the lines connecting the points A (25, 45, 30), B (25, 0, 75), C (44, 0, 56), D (44, 22, 34), E (40, 19, 41) and F (29, 40, 31) in the ternary phase diagram shown in FIG. 1.

At least one crystalline phase among merwinite (Ca$_3$MgSi$_2$O$_8$), monticellite (CaMgSiO$_4$) and calcium silicate (at least one of CaSiO$_3$, Ca$_3$Si$_2$O$_7$, Ca$_2$SiO$_4$ and Ca$_3$SiO$_5$) having larger thermal expansion coefficients than forsterite are deposited in the sample Nos. 1 to 11. The crystalline phases can be sintered at a temperature of 1100° C. or less while having preferable characteristics as an electrical insulation material for use in a circuit board such as a relative dielectric constant of 12, an insulation resistance (log IR) of more than 9, and a thermal expansion coefficient of 12 ppm/° C.

Merwinite, monticellite and calcium silicate are all deposited in sample Nos. 7 to 11 that fall within a limited area surrounded by the lines connecting the points A, B, C, D and E, or within an area surrounded by the lines connecting the points G (30, 19, 51), H (30, 5, 65), I (44, 5, 51) and J (44, 19, 37), giving a higher insulating property since the insulation resistance (log IR) exceeds 11.

It sometimes happens that only crystals other than the specified crystalline phases described above are deposited in the solid phase obtained by quenching for vitrification as described above, even when the composition falls within the area surrounded by the lines connecting the points A, B, C, D, E and F in FIG. 1. For example, when the glass composition according to sample No. 10 in TABLE 1 is cooled on a metal plate, akermanite is deposited in the quenched solid phase. Diopside and akermanite serve as principal crystalline phases without depositing desired crystalline phase when the solid phase containing akermanite is subjected to heat-treatment, confirming that the thermal expansion coefficient is less than 12 ppm/° C. It depends on the production method whether a crystalline glass having a desired crystalline phase is obtained or not, even when the same glass composition has been used.

Sintering becomes insufficient at a temperature of 1100° C. or less in the area X in FIG. 1 the composition of which is out of the range of the present invention, as will be evident from sintering property of the sample Nos. 12 and 13 shown in TABLE 2, causing deterioration of insulation resistance.

Likewise, the thermal expansion coefficient is reduced to less than 12 ppm/° C. in the area Y in FIG. 1 in which the composition is out of the range of the present invention as will be evident from the thermal expansion coefficient of the sample No. 14 shown in TABLE 2, because forsterite having a smaller thermal expansion coefficient than merwinite, monticellite and calcium silicate serves as a principal crystalline phase.

Likewise, the thermal expansion coefficient is reduced to 12 ppm/° C. in the area Z in FIG. 1 in which the composition is out of the range of the present invention as will be evident from the thermal expansion coefficient of the sample No. 15 shown in TABLE 2, because diopside ($CaMgSi_2O_6$) having a smaller thermal expansion coefficient than merwinite, monticellite and calcium silicate serves as a principal crystalline phase.

EXAMPLE 2

Example 2 relates to an insulator composition, in which glass powders according to the sample Nos. 4 and 11 in Example 1 were used.

Powders comprising various ceramics shown in TABLE 3 were prepared. Thermal expansion coefficients of respective ceramics are shown in TABLE 3. Alumina, forsterite, spinel, quartz, diopside, merwinite, monticellite, steatite, enstatite and calcium silicate ($CaSiO_3$ was used as the calcium silicate in this experiment) have thermal expansion coefficients of about 6.0 ppm/° C., respectively. Mullite having a thermal expansion coefficient of 4.0 ppm/° C., or less than about 6.0 ppm/° C., is listed as a comparative example.

TABLE 3

| CERAMIC | THERMAL EXPANSION COEFFICIENT (ppm/° C.) |
| --- | --- |
| ALUMINA | 7.0 |
| FORSTERITE | 11.0 |
| SPINEL | 8.5 |
| QUARTZ | 15.0 |
| DIOPSIDE | 8.0 |
| MERWINITE | 12.5 |
| MONTICELLITE | 12.0 |
| STEATITE | 6.0 |
| ENSTATITE | 7.0 |
| CALCIUM SILICATE | 10.0 ~ 14.0 |
| MULLITE | 4.0 |

Each glass powder and ceramic powder were weighed to obtain the composition (% by weight) shown in TABLE 4. A uniformly dispersed slurry was prepared by adding an organic binder and a solvent into each powder with mixing, followed by thoroughly mixing with a ball mill. The slurry was defoamed under reduced pressure.

TABLE 4

| Sample No. | Glass Powder | | Ceramic Powder | | | | | | | | | | |
| --- | --- | --- | --- | --- | --- | --- | --- | --- | --- | --- | --- | --- | --- |
| | Sample No. 4 | Sample No. 11 | Alumina | Forsterite | Spinel | Quartz | Diopside | Merwinite | Monticellite | Steatite | Enstatite | Calcium Silicate | Mullite |
| 21 | 100 | 0 | 0 | 0 | 0 | 0 | 0 | 0 | 0 | 0 | 0 | 0 | 0 |
| 22 | 80 | 0 | 20 | 0 | 0 | 0 | 0 | 0 | 0 | 0 | 0 | 0 | 0 |
| 23 | 50 | 0 | 50 | 0 | 0 | 0 | 0 | 0 | 0 | 0 | 0 | 0 | 0 |
| *24 | 40 | 0 | 60 | 0 | 0 | 0 | 0 | 0 | 0 | 0 | 0 | 0 | 0 |
| 25 | 0 | 100 | 0 | 0 | 0 | 0 | 0 | 0 | 0 | 0 | 0 | 0 | 0 |
| 26 | 0 | 80 | 20 | 0 | 0 | 0 | 0 | 0 | 0 | 0 | 0 | 0 | 0 |
| 27 | 0 | 50 | 50 | 0 | 0 | 0 | 0 | 0 | 0 | 0 | 0 | 0 | 0 |
| *28 | 0 | 40 | 60 | 0 | 0 | 0 | 0 | 0 | 0 | 0 | 0 | 0 | 0 |
| 29 | 50 | 0 | 0 | 50 | 0 | 0 | 0 | 0 | 0 | 0 | 0 | 0 | 0 |
| 30 | 50 | 0 | 0 | 0 | 50 | 0 | 0 | 0 | 0 | 0 | 0 | 0 | 0 |
| 31 | 50 | 0 | 0 | 0 | 0 | 50 | 0 | 0 | 0 | 0 | 0 | 0 | 0 |
| 32 | 50 | 0 | 0 | 0 | 0 | 0 | 50 | 0 | 0 | 0 | 0 | 0 | 0 |
| 33 | 50 | 0 | 0 | 0 | 0 | 0 | 0 | 50 | 0 | 0 | 0 | 0 | 0 |
| 34 | 50 | 0 | 0 | 0 | 0 | 0 | 0 | 0 | 50 | 0 | 0 | 0 | 0 |
| 35 | 50 | 0 | 0 | 0 | 0 | 0 | 0 | 0 | 0 | 50 | 0 | 0 | 0 |
| 36 | 50 | 0 | 0 | 0 | 0 | 0 | 0 | 0 | 0 | 0 | 50 | 0 | 0 |

TABLE 4-continued

| | Glass Powder | | Ceramic Powder | | | | | | | | | | |
|---|---|---|---|---|---|---|---|---|---|---|---|---|---|
| Sample No. | Sample No. 4 | Sample No. 11 | Alumina | Forsterite | Spinel | Quartz | Diopside | Merwinite | Monticellite | Steatite | Enstatite | Calcium Silicate | Mullite |
| 37 | 50 | 0 | 0 | 0 | 0 | 0 | 0 | 0 | 0 | 0 | 0 | 50 | 0 |
| *38 | 50 | 0 | 0 | 0 | 0 | 0 | 0 | 0 | 0 | 0 | 0 | 0 | 50 |

Respective green sheets with a thickness of 0.2 mm were formed on a film from the slurries thus obtained by casting using a doctor blade method. These green sheets were dried, peeled off from the film and punched to obtain the green sheets having a given dimension.

A plurality of respective green sheets were laminated and press-molded to obtain molded bodies.

The molded green sheet was fired at 1100° C. for 2 hours with a heating rate of 200° C. per hour, obtaining a sintered insulator composition.

Thermal expansion coefficients were evaluated by the same method as used in Example 1 with respect to the sintered insulator compositions. The results of evaluation are listed in TABLE 5.

TABLE 5

| SAMPLE No. | THERMAL EXPANSION COEFFICIENT |
|---|---|
| 21 | 12.0 |
| 22 | 10.9 |
| 23 | 9.3 |
| *24 | NOT SINTERED |
| 25 | 13.0 |
| 26 | 11.7 |
| 27 | 9.8 |
| *28 | NOT SINTERED |
| 29 | 11.3 |
| 30 | 10.0 |
| 31 | 13.3 |
| 32 | 9.8 |
| 33 | 12.0 |
| 34 | 11.8 |
| 35 | 9.3 |
| 36 | 9.3 |
| 37 | 10.9 |
| *38 | 7.7 |

The reason why the range according to the present invention with respect to the insulator composition, or the range prescribed in the preferred embodiment of the present invention, is limited will be described hereinafter with reference to TABLE 3, TABLE 4 and TABLE 5.

The ceramic powder contained in the insulator composition according to the present invention should have a thermal expansion coefficient of about 6.0 ppm/° C. or more since, when a ceramic with a thermal expansion coefficient of 6.0 ppm/° C. or less is used, sintered bodies with a thermal expansion coefficient of 8 ppm/° C. or more could not be sometimes obtained.

Actually, while a mullite powder having a thermal expansion coefficient of less than 6.0 ppm/° C., namely 4.0 ppm/° C., as shown in TABLE 3 was used as a ceramic powder in the sample No. 38, a sintered body with a thermal expansion coefficient of 8 ppm/° C. or more cannot be obtained as shown in TABLE 5 even when the crystalline glass has a thermal expansion coefficient of 12 ppm/° C. or more (see the column of "thermal expansion coefficient" of the sample Nos. 4 and 11 in TABLE 2).

The insulator composition in the preferred embodiment according to the present invention contains a crystalline glass powder in a proportion of 50% by weight or more. When the composition contains the crystalline glass powder in a proportion of less than 50%, sintering at a temperature of 1100° C. becomes difficult, sometimes causing initial short circuit in the circuit board using the composition as an insulator material or compromising reliability in a wet load test.

Actually, since the sample Nos. 24 and 28 contain less than 50% by weight, namely 40% by weight, of the glass powder as shown in TABLE 4, sintering becomes insufficient as shown in TABLE 5.

EXAMPLE 3

Example 3 refers to a insulating paste and multilayer circuit board printed on a thick film.

A glass powder and ceramic powder were weighed to be a composition of the samples shown in TABLE 4 in Example 2 above. Forty parts by weight of an organic vehicle prepared by dissolving an acrylic resin in α-terpineol was added to 60 parts by weight each of the mixed powders to prepare an insulating paste after kneading.

Multilayer circuit boards printed on a thick film on which insulating layers were formed using the insulating pastes obtained were manufactured as follows.

Figure 2:
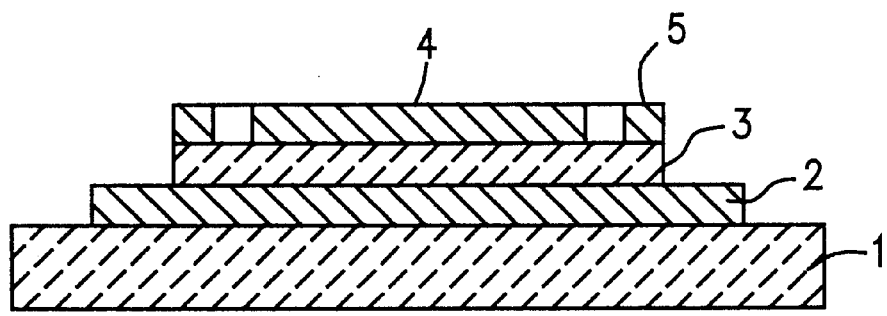
FIG. 2 shows one example of the thick film circuit board according to the present invention, illustrating a cross section of the thick film multilayer circuit board prepared for evaluating relative dielectric constant and insulating property in Example 3.

An alumina substrate with a thickness of 0.635 mm was prepared as a substrate 1 as shown in FIG. 2. An Ag/Pd paste was screen-printed on the substrate, and a lower conductor layer 2 with a dimension of 8 mm was formed by firing at 1100° C. in the air. The lower conductor layer 2 serves as one of the electrodes of a capacitor.

The insulating paste prepared previously was screen-printed on the lower conductor layer 2 and the printed pattern was dried at 1100° C. in the air, thereby forming a disk of the insulating layer 3 with a diameter of 6 mm on the lower conductor layer 2.

An upper conductor layer 4 with a diameter of 4 mm to serve the other electrode of the capacitor was formed by screen-printing the Ag paste on the insulating layer 3 followed by firing in the air, besides forming a guard electrode 5 so as to surround the upper conductor layer 4 at a distance by 500 μm apart from the periphery of the upper conductor layer 4, thereby completing the desired multilayer circuit board printed on a thick film.

Characteristics of the insulating layer 3, namely the relative dielectric constant ($\epsilon_r$) and insulation resistance (IR), were evaluated by measuring the characteristics of a capacitor using the lower conductor layer 2 and upper conductor layer 4 as a pair of confronting electrodes and the insulating layer 3 as a dielectric layer.

The relative dielectric constant ($\epsilon_r$) was calculated from the electrostatic capacitance and dimension of the capacitor, wherein the electrostatic capacitance was measured at a frequency of 1 MHZ and a voltage of 1 Vrms at a temperature of 25° C. while protecting the electrodes with the guard electrode 5.

The insulation resistance (IR) was measured by impressing a direct current voltage of 100 V for 1 minute after impressing a voltage of 100 V for 1000 hours under the condition of a temperature of 85° C. and RH of 85%. The evaluation results are listed in TABLE 6.

TABLE 6

| SAMPLE No. | RELATIVE DIELECTRIC CONSTANT ($\epsilon_r$) | INSULATION RESISTANT logIR |
|---|---|---|
| 21 | 7.0 | >9 |
| 22 | 7.6 | >9 |
| 23 | 8.5 | >9 |
| *24 | — | — |
| 25 | 8.0 | >9 |
| 26 | 8.4 | >9 |
| 27 | 9.0 | >9 |
| *28 | — | — |
| 29 | 7.3 | >9 |
| 30 | 7.5 | >9 |
| 31 | 5.4 | >9 |
| 32 | 6.5 | >9 |
| 33 | 7.5 | >9 |
| 34 | 7.5 | >9 |
| 35 | 7.0 | >9 |
| 36 | 6.5 | >9 |
| 37 | 7.6 | >9 |
| *38 | 7.0 | >9 |

The sample Nos. 24 and 28 marked by (*) could not be evaluated because the insulating layers 3 of the samples could not be sufficiently sintered.

A relative dielectric constant of 10 or less and an insulation resistance of more than 9 were obtained in the sample Nos. 21 to 23, 25 to 27 and 29 to 37 having the compositions within the range of the present invention. Although similar characteristic were obtained in the sample No. 38 having a composition out of the range of the present invention, sample No. 38 is not preferable because a sintered body having a thermal expansion coefficient of 8 ppm/° C. or more could not be obtained as shown in Example 2.

As is evident from Example 1, the present invention provides a crystalline glass composition for use in a circuit board containing $SiO_2$, MgO and CaO, the composition ratio of $SiO_2$, MgO and CaO represented by % by weight falling within an area surrounded by the lines connecting the points A (25, 45, 30), B (25, 0, 75), C (44, 0, 56), D (44, 22, 34), E (40, 19, 41) and F (29, 40, 31) in the ternary phase diagram shown in FIG. 1, wherein at least one crystalline phase among merwinite ($Ca_3MgSi_2O_8$), monticellite ($CaMgSiO_4$) and calcium silicate (at least one of $CaSiO_3$, $Ca_3Si_2O_7$, $Ca_2SiO_4$ and $Ca_3SiO_5$) are made to deposit by heat-treating the composition. The composition can be sintered at a temperature of 1100° C. or less, endowing the sintered composition with advantageous characteristics of a relative dielectric constant of as low as 12 or less and thermal expansion coefficient of as high as 12 ppm or more for the electric insulator material for use in a circuit board.

When the composition ratio of $SiO_2$, MgO and CaO contained in the crystalline glass composition for use in a circuit board according to the present invention falls within an area surrounded by the lines connecting the points G (30, 19, 51), H (30, 5, 65), I (44, 5, 51), and J (44, 19, 37) in the ternary phase diagram shown in FIG. 1, any of the crystalline phases among merwinite, monticellite and calcium silicate can be deposited, thereby giving an electrical insulator material having a higher insulation resistance.

Accordingly, the sintered crystalline glass obtained by firing the crystalline glass composition for use in a circuit board according to the present invention can be miniaturized and compacted, enabling the composition to be advantageously used for multilayered circuit boards that are required to have high signal propagation speed.

As is evident from the descriptions in Examples 2 and 3, a ceramic powder with a thermal expansion coefficient of about 6.0 ppm/° C. or more is added to the powder comprising the crystalline glass composition in the insulator composition and insulating paste according to the present invention. Therefore, a sintered body having a thermal expansion coefficient of about 8 ppm/° C. or more and a relative dielectric constant of about 10 or less can be obtained for use in electrical insulator having high resistivity.

The insulating paste according to the present invention advantageously provides an insulating layer for the thick film multilayer circuit board that is miniaturized and compacted, and required to have high signal propagation speed, for example the circuit boards for use in a hybrid IC substrate, packaging, a LC filter chip, a delay line chip and a laminated capacitor chip.

Troubles such as difficulty in sintering at a temperature of 1100° C. or less, incidence of initial short circuit in the circuit board using the insulator composition or compromised reliability in a wet load test can be effectively prevented by allowing the crystalline glass powder to contain the insulator composition according to the present invention in a proportion of about 50% by weight or more.

EXAMPLE 4

$SiO_2$, $MgCO_3$, $CaCO_3$, $Al_2O_3$, ZnO, $SrCO_3$, $BaCO_3$, $Li_2CO_3$, $Na_2CO_3$, $K_2CO_3$ and $B_2O_3$ were prepared as starting materials of the glass component. After mixing the materials to be the compositions shown in TABLE 7 through TABLE 11, the mixtures obtained were melted at a temperature of 1500 to 1750° C. to prepare fused glasses. Then, the fused glasses were quenched by placing in pure water to obtain glasses.

TABLE 7

Figure 3:
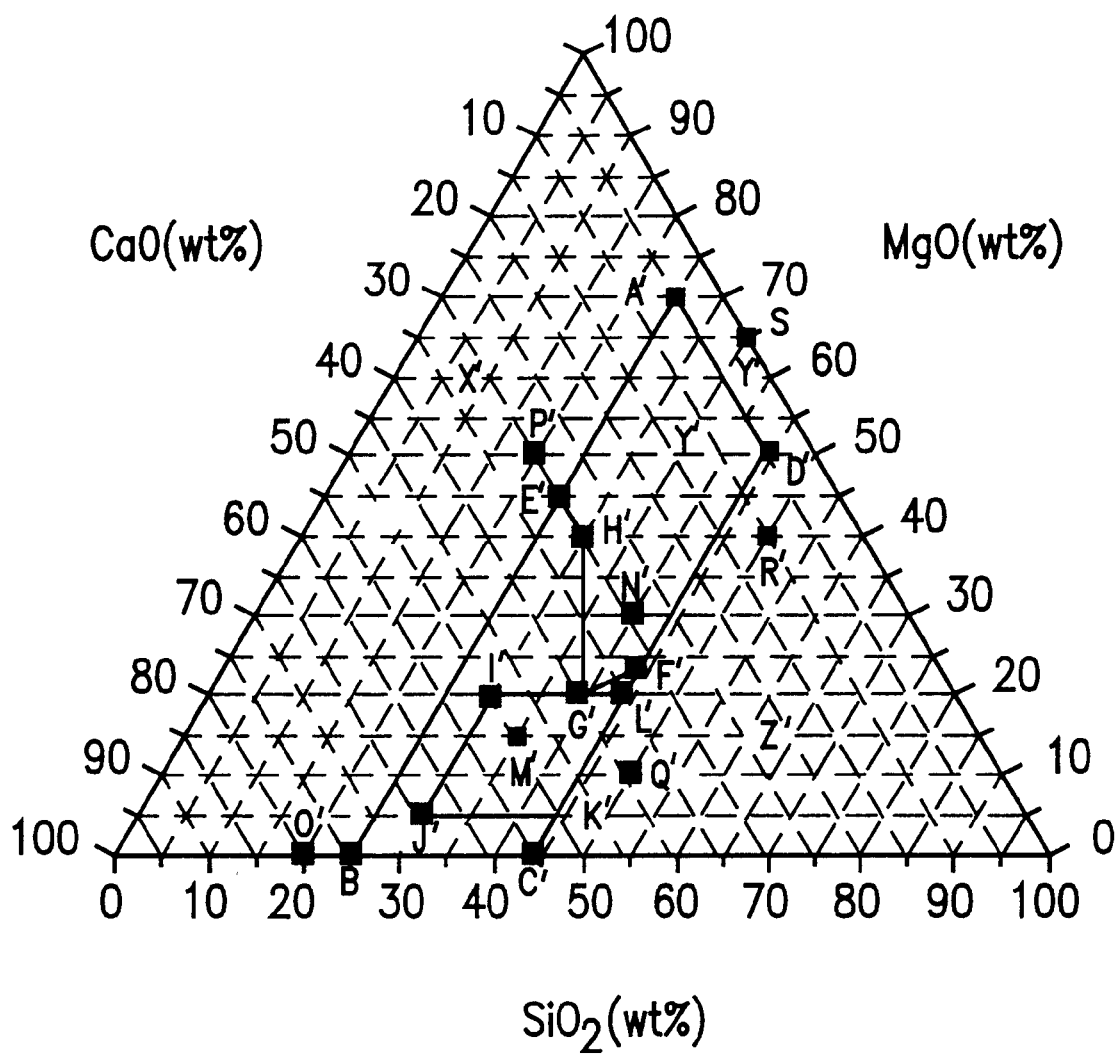
FIG. 3 shows a ternary phase diagram indicating the composition ranges of SiO$_2$, MgO and CaO contained in another crystalline glass composition for use in a circuit board according to the present invention.

| SAMPLE NO. | | COMPOSITION OF GLASS (PARTS BY WEIGHT) | | | | | | | | | | | REFERENCE MARKS IN TERNARY PHASE DIAGRAM IN FIG. 3 |
|---|---|---|---|---|---|---|---|---|---|---|---|---|---|
| | | $SiO_2$ | MgO | CaO | $Al_2O_3$ | ZnO | SrO | BaO | $Li_2O$ | $Na_2O$ | $K_2O$ | $B_2O_3$ | |
| 1001 | * | 25 | 70 | 5 | 0 | 0 | 0 | 0 | 0 | 0 | 0 | 0 | A' |
| 1002 | * | 25 | 0 | 75 | 0 | 0 | 0 | 0 | 0 | 0 | 0 | 0 | B' |
| 1003 | * | 44 | 0 | 56 | 0 | 0 | 0 | 0 | 0 | 0 | 0 | 0 | C' |
| 1004 | * | 44 | 51 | 5 | 0 | 0 | 0 | 0 | 0 | 0 | 0 | 0 | D' |
| 1005 | * | 25 | 45 | 30 | 0 | 0 | 0 | 0 | 0 | 0 | 0 | 0 | E' |

TABLE 7-continued

| SAMPLE NO. | | COMPOSITION OF GLASS (PARTS BY WEIGHT) | | | | | | | | | | | REFERENCE MARKS IN TERNARY PHASE DIAGRAM IN FIG. 3 |
|---|---|---|---|---|---|---|---|---|---|---|---|---|---|
| | | SiO₂ | MgO | CaO | Al₂O₃ | ZnO | SrO | BaO | Li₂O | Na₂O | K₂O | B₂O₃ | |
| 1006 | * | 44 | 22 | 34 | 0 | 0 | 0 | 0 | 0 | 0 | 0 | 0 | F' |
| 1007 | * | 40 | 19 | 41 | 0 | 0 | 0 | 0 | 0 | 0 | 0 | 0 | G' |
| 1008 | * | 29 | 40 | 31 | 0 | 0 | 0 | 0 | 0 | 0 | 0 | 0 | H' |
| 1009 | * | 30 | 19 | 51 | 0 | 0 | 0 | 0 | 0 | 0 | 0 | 0 | I' |
| 1010 | * | 30 | 5 | 65 | 0 | 0 | 0 | 0 | 0 | 0 | 0 | 0 | J' |
| 1011 | * | 44 | 5 | 51 | 0 | 0 | 0 | 0 | 0 | 0 | 0 | 0 | K' |
| 1012 | * | 44 | 19 | 37 | 0 | 0 | 0 | 0 | 0 | 0 | 0 | 0 | L' |
| 1013 | * | 35 | 15 | 50 | 0 | 0 | 0 | 0 | 0 | 0 | 0 | 0 | M' |
| 1014 | * | 40 | 30 | 30 | 0 | 0 | 0 | 0 | 0 | 0 | 0 | 0 | N' |
| 1015 | * | 20 | 0 | 80 | 0 | 0 | 0 | 0 | 0 | 0 | 0 | 0 | O' |
| 1016 | * | 20 | 50 | 30 | 0 | 0 | 0 | 0 | 0 | 0 | 0 | 0 | P' |
| 1017 | * | 50 | 10 | 40 | 0 | 0 | 0 | 0 | 0 | 0 | 0 | 0 | Q' |
| 1018 | * | 50 | 40 | 10 | 0 | 0 | 0 | 0 | 0 | 0 | 0 | 0 | R' |
| 1019 | | 25 | 70 | 5 | 0.5 | 0 | 0 | 0 | 0 | 0 | 0 | 0 | A' |
| 1020 | | 25 | 0 | 75 | 0.5 | 0 | 0 | 0 | 0 | 0 | 0 | 0 | B' |
| 1021 | | 44 | 0 | 56 | 0.5 | 0 | 0 | 0 | 0 | 0 | 0 | 0 | C' |
| 1022 | | 44 | 51 | 5 | 0.5 | 0 | 0 | 0 | 0 | 0 | 0 | 0 | D' |
| 1023 | | 35 | 15 | 50 | 0.5 | 0 | 0 | 0 | 0 | 0 | 0 | 0 | M' |
| 1024 | | 40 | 30 | 30 | 0.5 | 0 | 0 | 0 | 0 | 0 | 0 | 0 | N' |
| 1025 | * | 20 | 0 | 80 | 0.5 | 0 | 0 | 0 | 0 | 0 | 0 | 0 | O' |
| 1026 | * | 20 | 50 | 30 | 0.5 | 0 | 0 | 0 | 0 | 0 | 0 | 0 | P' |
| 1027 | * | 50 | 10 | 40 | 0.5 | 0 | 0 | 0 | 0 | 0 | 0 | 0 | Q' |
| 1028 | * | 50 | 40 | 10 | 0.5 | 0 | 0 | 0 | 0 | 0 | 0 | 0 | R' |
| 1029 | | 25 | 70 | 5 | 25 | 0 | 0 | 0 | 0 | 0 | 0 | 0 | A' |
| 1030 | | 25 | 0 | 75 | 25 | 0 | 0 | 0 | 0 | 0 | 0 | 0 | B' |
| 1031 | | 44 | 0 | 56 | 25 | 0 | 0 | 0 | 0 | 0 | 0 | 0 | C' |
| 1032 | | 44 | 51 | 5 | 25 | 0 | 0 | 0 | 0 | 0 | 0 | 0 | D' |
| 1033 | | 35 | 15 | 50 | 25 | 0 | 0 | 0 | 0 | 0 | 0 | 0 | M' |
| 1034 | | 40 | 30 | 30 | 25 | 0 | 0 | 0 | 0 | 0 | 0 | 0 | N' |
| 1035 | * | 25 | 70 | 5 | 30 | 0 | 0 | 0 | 0 | 0 | 0 | 0 | A' |
| 1036 | * | 25 | 0 | 75 | 30 | 0 | 0 | 0 | 0 | 0 | 0 | 0 | B' |
| 1037 | * | 44 | 0 | 56 | 30 | 0 | 0 | 0 | 0 | 0 | 0 | 0 | C' |
| 1038 | * | 44 | 51 | 5 | 30 | 0 | 0 | 0 | 0 | 0 | 0 | 0 | D' |
| 1039 | * | 35 | 15 | 50 | 30 | 0 | 0 | 0 | 0 | 0 | 0 | 0 | M' |
| 1040 | * | 40 | 30 | 30 | 30 | 0 | 0 | 0 | 0 | 0 | 0 | 0 | N' |

TABLE 8

| SAMPLE NO. | | COMPOSITION OF GLASS (PARTS BY WEIGHT) | | | | | | | | | | | REFERENCE MARKS IN TERNARY PHASE DIAGRAM IN FIG. 3 |
|---|---|---|---|---|---|---|---|---|---|---|---|---|---|
| | | SiO₂ | MgO | CaO | Al₂O₃ | ZnO | SrO | BaO | Li₂O | Na₂O | K₂O | B₂O₃ | |
| 1041 | | 25 | 70 | 5 | 0 | 0.5 | 0 | 0 | 0 | 0 | 0 | 0 | A' |
| 1042 | | 25 | 0 | 75 | 0 | 0.5 | 0 | 0 | 0 | 0 | 0 | 0 | B' |
| 1043 | | 44 | 0 | 56 | 0 | 0.5 | 0 | 0 | 0 | 0 | 0 | 0 | C' |
| 1044 | | 44 | 51 | 5 | 0 | 0.5 | 0 | 0 | 0 | 0 | 0 | 0 | D' |
| 1045 | | 35 | 15 | 50 | 0 | 0.5 | 0 | 0 | 0 | 0 | 0 | 0 | M' |
| 1046 | | 40 | 30 | 30 | 0 | 0.5 | 0 | 0 | 0 | 0 | 0 | 0 | N' |
| 1047 | | 25 | 70 | 5 | 0 | 10 | 0 | 0 | 0 | 0 | 0 | 0 | A' |
| 1048 | | 25 | 0 | 75 | 0 | 10 | 0 | 0 | 0 | 0 | 0 | 0 | B' |
| 1049 | | 44 | 0 | 56 | 0 | 10 | 0 | 0 | 0 | 0 | 0 | 0 | C' |
| 1050 | | 44 | 51 | 5 | 0 | 10 | 0 | 0 | 0 | 0 | 0 | 0 | D' |
| 1051 | | 35 | 15 | 50 | 0 | 10 | 0 | 0 | 0 | 0 | 0 | 0 | M' |
| 1052 | | 40 | 30 | 30 | 0 | 10 | 0 | 0 | 0 | 0 | 0 | 0 | N' |
| 1053 | * | 25 | 70 | 5 | 0 | 15 | 0 | 0 | 0 | 0 | 0 | 0 | A' |
| 1054 | * | 25 | 0 | 75 | 0 | 15 | 0 | 0 | 0 | 0 | 0 | 0 | B' |
| 1055 | * | 44 | 0 | 56 | 0 | 15 | 0 | 0 | 0 | 0 | 0 | 0 | C' |
| 1056 | * | 44 | 51 | 5 | 0 | 15 | 0 | 0 | 0 | 0 | 0 | 0 | D' |
| 1057 | * | 35 | 15 | 50 | 0 | 15 | 0 | 0 | 0 | 0 | 0 | 0 | M' |
| 1058 | * | 40 | 30 | 30 | 0 | 15 | 0 | 0 | 0 | 0 | 0 | 0 | N' |
| 1059 | | 25 | 70 | 5 | 0 | 0 | 0.5 | 0 | 0 | 0 | 0 | 0 | A' |
| 1060 | | 25 | 0 | 75 | 0 | 0 | 0.5 | 0 | 0 | 0 | 0 | 0 | B' |
| 1061 | | 44 | 0 | 56 | 0 | 0 | 0.5 | 0 | 0 | 0 | 0 | 0 | C' |
| 1062 | | 44 | 51 | 5 | 0 | 0 | 0.5 | 0 | 0 | 0 | 0 | 0 | D' |
| 1063 | | 35 | 1s | 50 | 0 | 0 | 0.5 | 0 | 0 | 0 | 0 | 0 | M' |
| 1064 | | 40 | 30 | 30 | 0 | 0 | 0.5 | 0 | 0 | 0 | 0 | 0 | N' |
| 1065 | * | 20 | 0 | 80 | 0 | 0 | 0.5 | 0 | 0 | 0 | 0 | 0 | O' |
| 1066 | * | 20 | 50 | 30 | 0 | 0 | 0.5 | 0 | 0 | 0 | 0 | 0 | P' |

TABLE 8-continued

| SAMPLE NO. | | COMPOSITION OF GLASS (PARTS BY WEIGHT) | | | | | | | | | | | REFERENCE MARKS IN TERNARY PHASE DIAGRAM IN FIG. 3 |
|---|---|---|---|---|---|---|---|---|---|---|---|---|---|
| | | $SiO_2$ | MgO | CaO | $Al_2O_3$ | ZnO | SrO | BaO | $Li_2O$ | $Na_2O$ | $K_2O$ | $B_2O_3$ | |
| 1067 | * | 50 | 10 | 40 | 0 | 0 | 0.5 | 0 | 0 | 0 | 0 | 0 | Q' |
| 1068 | * | 50 | 40 | 10 | 0 | 0 | 0.5 | 0 | 0 | 0 | 0 | 0 | R' |
| 1069 | | 25 | 70 | 5 | 0 | 0 | 10 | 0 | 0 | 0 | 0 | 0 | A' |
| 1070 | | 25 | 0 | 75 | 0 | 0 | 10 | 0 | 0 | 0 | 0 | 0 | B' |
| 1071 | | 44 | 0 | 56 | 0 | 0 | 10 | 0 | 0 | 0 | 0 | 0 | C' |
| 1072 | | 44 | 51 | 5 | 0 | 0 | 10 | 0 | 0 | 0 | 0 | 0 | D' |
| 1073 | | 35 | 15 | 50 | 0 | 0 | 10 | 0 | 0 | 0 | 0 | 0 | M' |
| 1074 | | 40 | 30 | 30 | 0 | 0 | 10 | 0 | 0 | 0 | 0 | 0 | N' |
| 1075 | * | 25 | 70 | 5 | 0 | 0 | 15 | 0 | 0 | 0 | 0 | 0 | A' |
| 1076 | * | 25 | 0 | 75 | 0 | 0 | 15 | 0 | 0 | 0 | 0 | 0 | B' |
| 1077 | * | 44 | 0 | 56 | 0 | 0 | 15 | 0 | 0 | 0 | 0 | 0 | C' |
| 1078 | * | 44 | 51 | 5 | 0 | 0 | 15 | 0 | 0 | 0 | 0 | 0 | D' |
| 1079 | * | 35 | 15 | 50 | 0 | 0 | 15 | 0 | 0 | 0 | 0 | 0 | M' |
| 1080 | * | 40 | 30 | 30 | 0 | 0 | 15 | 0 | 0 | 0 | 0 | 0 | N' |

TABLE 9

| SAMPLE NO. | | COMPOSITION OF GLASS (PARTS BY WEIGHT) | | | | | | | | | | | REFERENCE MARKS IN TERNARY PHASE DIAGRAM IN FIG. 3 |
|---|---|---|---|---|---|---|---|---|---|---|---|---|---|
| | | $SiO_2$ | MgO | CaO | $Al_2O_3$ | ZnO | SrO | BaO | $Li_2O$ | $Na_2O$ | $K_2O$ | $B_2O_3$ | |
| 1081 | | 25 | 70 | 5 | 0 | 0 | 0 | 0.5 | 0 | 0 | 0 | 0 | A' |
| 1082 | | 25 | 0 | 75 | 0 | 0 | 0 | 0.5 | 0 | 0 | 0 | 0 | B' |
| 1083 | | 44 | 0 | 56 | 0 | 0 | 0 | 0.5 | 0 | 0 | 0 | 0 | C' |
| 1084 | | 44 | 51 | 5 | 0 | 0 | 0 | 0 | .50 | 0 | 0 | 0 | D' |
| 1085 | | 35 | 15 | 50 | 0 | 0 | 0 | 0 | 0.5 | 0 | 0 | 0 | M' |
| 1086 | | 40 | 30 | 30 | 0 | 0 | 0 | 0.5 | 0 | 0 | 0 | 0 | N' |
| 1087 | | 25 | 70 | 5 | 0 | 0 | 0 | 0 | 10 | 0 | 0 | 0 | A' |
| 1088 | | 25 | 0 | 75 | 0 | 0 | 0 | 0 | 10 | 0 | 0 | 0 | B' |
| 1089 | | 44 | 0 | 56 | 0 | 0 | 0 | 0 | 10 | 0 | 0 | 0 | C' |
| 1090 | | 44 | 51 | 5 | 0 | 0 | 0 | 0 | 10 | 0 | 0 | 0 | D' |
| 1091 | | 35 | 15 | 50 | 0 | 0 | 0 | 0 | 10 | 0 | 0 | 0 | M' |
| 1092 | | 40 | 30 | 30 | 0 | 0 | 0 | 0 | 10 | 0 | 0 | 0 | N' |
| 1093 | * | 25 | 70 | 5 | 0 | 0 | 0 | 0 | 15 | 0 | 0 | 0 | A' |
| 1094 | * | 25 | 0 | 75 | 0 | 0 | 0 | 0 | 15 | 0 | 0 | 0 | B' |
| 1095 | * | 44 | 0 | 56 | 0 | 0 | 0 | 0 | 15 | 0 | 0 | 0 | C' |
| 1096 | * | 44 | 51 | 5 | 0 | 0 | 0 | 0 | 15 | 0 | 0 | 0 | D' |
| 1097 | * | 35 | 15 | 50 | 0 | 0 | 0 | 0 | 15 | 0 | 0 | 0 | M' |
| 1098 | * | 40 | 30 | 30 | 0 | 0 | 0 | 0 | 15 | 0 | 0 | 0 | N' |
| 1099 | | 25 | 70 | 5 | 0 | 0 | 0 | 0 | 0 | 0.5 | 0 | 0 | A' |
| 1100 | | 25 | 0 | 75 | 0 | 0 | 0 | 0 | 0 | 0.5 | 0 | 0 | B' |
| 1101 | | 44 | 0 | 56 | 0 | 0 | 0 | 0 | 0 | 0.5 | 0 | 0 | C' |
| 1102 | | 44 | 51 | 5 | 0 | 0 | 0 | 0 | 0 | 0.5 | 0 | 0 | D' |
| 1103 | | 35 | 15 | 50 | 0 | 0 | 0 | 0 | 0 | 0.5 | 0 | 0 | M' |
| 1104 | | 40 | 30 | 30 | 0 | 0 | 0 | 0 | 0 | 0.5 | 0 | 0 | N' |
| 1105 | * | 20 | 0 | 80 | 0 | 0 | 0 | 0 | 0 | 0.5 | 0 | 0 | O' |
| 1106 | * | 20 | 50 | 30 | 0 | 0 | 0 | 0 | 0 | 0.5 | 0 | 0 | P' |
| 1107 | * | 50 | 10 | 40 | 0 | 0 | 0 | 0 | 0 | 0.5 | 0 | 0 | Q' |
| 1108 | * | 50 | 40 | 10 | 0 | 0 | 0 | 0 | 0 | 0.5 | 0 | 0 | R' |
| 1109 | | 25 | 70 | 5 | 0 | 0 | 0 | 0 | 0 | 5 | 0 | 0 | A' |
| 1110 | | 25 | 0 | 75 | 0 | 0 | 0 | 0 | 0 | 5 | 0 | 0 | B' |
| 1111 | | 44 | 0 | 56 | 0 | 0 | 0 | 0 | 0 | 5 | 0 | 0 | C' |
| 1112 | | 44 | 51 | 5 | 0 | 0 | 0 | 0 | 0 | 5 | 0 | 0 | D' |
| 1113 | | 35 | 15 | 50 | 0 | 0 | 0 | 0 | 0 | 5 | 0 | 0 | M' |
| 1114 | | 40 | 30 | 30 | 0 | 0 | 0 | 0 | 0 | 10 | 0 | 0 | N' |
| 1115 | * | 25 | 70 | 5 | 0 | 0 | 0 | 0 | 0 | 10 | 0 | 0 | A' |
| 1116 | * | 25 | 0 | 75 | 0 | 0 | 0 | 0 | 0 | 10 | 0 | 0 | B' |
| 1117 | * | 44 | 0 | 56 | 0 | 0 | 0 | 0 | 0 | 10 | 0 | 0 | C' |
| 1118 | * | 44 | 51 | 5 | 0 | 0 | 0 | 0 | 0 | 10 | 0 | 0 | D' |
| 1119 | * | 35 | 15 | 50 | 0 | 0 | 0 | 0 | 0 | 10 | 0 | 0 | M' |
| 1120 | * | 40 | 30 | 30 | 0 | 0 | 0 | 0 | 0 | 10 | 0 | 0 | N' |

TABLE 10

| SAMPLE No. | | COMPOSITION OF GLASS (PARTS BY WEIGHT) | | | | | | | | | | | REFERENCE MARKS IN TERNARY PHASE DIAGRAM IN FIG. 3 |
|---|---|---|---|---|---|---|---|---|---|---|---|---|---|
| | | $SiO_2$ | MgO | CaO | $Al_2O_3$ | ZnO | SrO | BaO | $Li_2O$ | $Na_2O$ | $K_2O$ | $B_2O_3$ | |
| 1121 | | 25 | 70 | 5 | 0 | 0 | 0 | 0 | 0 | 0.5 | 0 | 0 | A' |
| 1122 | | 25 | 0 | 75 | 0 | 0 | 0 | 0 | 0 | 0.5 | 0 | 0 | B' |
| 1123 | | 44 | 0 | 56 | 0 | 0 | 0 | 0 | 0 | 0.5 | 0 | 0 | C' |
| 1124 | | 44 | 51 | 5 | 0 | 0 | 0 | 0 | 0 | 0.5 | 0 | 0 | D' |
| 1125 | | 35 | 15 | 50 | 0 | 0 | 0 | 0 | 0 | 0.5 | 0 | 0 | M' |
| 1126 | | 40 | 30 | 30 | 0 | 0 | 0 | 0 | 0 | 0.5 | 0 | 0 | N' |
| 1127 | | 25 | 70 | 5 | 0 | 0 | 0 | 0 | 0 | 5 | 0 | 0 | A' |
| 1128 | | 25 | 0 | 75 | 0 | 0 | 0 | 0 | 0 | 5 | 0 | 0 | B' |
| 1129 | | 44 | 0 | 56 | 0 | 0 | 0 | 0 | 0 | 5 | 0 | 0 | C' |
| 1130 | | 44 | 51 | 5 | 0 | 0 | 0 | 0 | 0 | 5 | 0 | 0 | D' |
| 1131 | | 35 | 15 | 50 | 0 | 0 | 0 | 0 | 0 | 5 | 0 | 0 | M' |
| 1132 | | 40 | 30 | 30 | 0 | 0 | 0 | 0 | 0 | 5 | 0 | 0 | N' |
| 1133 | * | 25 | 70 | 5 | 0 | 0 | 0 | 0 | 0 | 10 | 0 | 0 | A' |
| 1134 | * | 25 | 0 | 75 | 0 | 0 | 0 | 0 | 0 | 10 | 0 | 0 | B' |
| 1135 | * | 44 | 0 | 56 | 0 | 0 | 0 | 0 | 0 | 10 | 0 | 0 | C' |
| 1136 | * | 44 | 51 | 5 | 0 | 0 | 0 | 0 | 0 | 10 | 0 | 0 | D' |
| 1137 | * | 35 | 15 | 50 | 0 | 0 | 0 | 0 | 0 | 10 | 0 | 0 | M' |
| 1138 | * | 40 | 30 | 30 | 0 | 0 | 0 | 0 | 0 | 10 | 0 | 0 | N' |
| 1139 | | 25 | 70 | 5 | 0 | 0 | 0 | 0 | 0 | 10 | 0.5 | 0 | A' |
| 1140 | | 25 | 0 | 75 | 0 | 0 | 0 | 0 | 0 | 0 | 0.5 | 0 | B' |
| 1141 | | 44 | 0 | 56 | 0 | 0 | 0 | 0 | 0 | 0 | 0.5 | 0 | C' |
| 1142 | | 44 | 51 | 5 | 0 | 0 | 0 | 0 | 0 | 0 | 0.5 | 0 | D' |
| 1143 | | 35 | 15 | 50 | 0 | 0 | 0 | 0 | 0 | 0 | 0.5 | 0 | M' |
| 1144 | | 40 | 30 | 30 | 0 | 0 | 0 | 0 | 0 | 0 | 0.5 | 0 | N' |
| 1145 | | 25 | 70 | 5 | 0 | 0 | 0 | 0 | 0 | 0 | 5 | 0 | A' |
| 1146 | | 25 | 0 | 75 | 0 | 0 | 0 | 0 | 0 | 0 | 5 | 0 | B' |
| 1147 | | 44 | 0 | 56 | 0 | 0 | 0 | 0 | 0 | 0 | 5 | 0 | C' |
| 1148 | | 44 | 51 | 5 | 0 | 0 | 0 | 0 | 0 | 0 | 5 | 0 | D' |
| 1149 | | 35 | 15 | 50 | 0 | 0 | 0 | 0 | 0 | 0 | 5 | 0 | M' |
| 1150 | | 40 | 30 | 30 | 0 | 0 | 0 | 0 | 0 | 0 | 5 | 0 | N' |
| 1151 | * | 25 | 70 | 5 | 0 | 0 | 0 | 0 | 0 | 0 | 10 | 0 | A' |
| 1152 | * | 25 | 0 | 75 | 0 | 0 | 0 | 0 | 0 | 0 | 10 | 0 | B' |
| 1153 | * | 44 | 0 | 56 | 0 | 0 | 0 | 0 | 0 | 0 | 10 | 0 | C' |
| 1154 | * | 44 | 51 | 5 | 0 | 0 | 0 | 0 | 0 | 0 | 10 | 0 | D' |
| 1155 | * | 35 | 15 | 50 | 0 | 0 | 0 | 0 | 0 | 0 | 10 | 0 | M' |
| 1156 | * | 40 | 30 | 30 | 0 | 0 | 0 | 0 | 0 | 0 | 10 | 0 | N' |

TABLE 11

| SAMPLE No. | | COMPOSITION OF GLASS (PARTS BY WEIGHT) | | | | | | | | | | | REFERENCE MARKS IN TERNARY PHASE DIAGRAM IN FIG. 3 |
|---|---|---|---|---|---|---|---|---|---|---|---|---|---|
| | | $SiO_2$ | MgO | CaO | $Al_2O_3$ | ZnO | SrO | BaO | $Li_2O$ | $Na_2O$ | $K_2O$ | $B_2O_3$ | |
| 1157 | | 25 | 70 | 5 | 0 | 0 | 0 | 0 | 0 | 0 | 0 | 0.5 | A' |
| 1158 | | 25 | 0 | 75 | 0 | 0 | 0 | 0 | 0 | 0 | 0 | 0.5 | B' |
| 1159 | | 44 | 0 | 56 | 0 | 0 | 0 | 0 | 0 | 0 | 0 | 0.5 | C' |
| 1160 | | 44 | 51 | 5 | 0 | 0 | 0 | 0 | 0 | 0 | 0 | 0.5 | D' |
| 1161 | | 35 | 15 | 50 | 0 | 0 | 0 | 0 | 0 | 0 | 0 | 0.5 | M' |
| 1161 | | 40 | 30 | 30 | 0 | 0 | 0 | 0 | 0 | 0 | 0 | 0.5 | N' |
| 1163 | * | 20 | 0 | 80 | 0 | 0 | 0 | 0 | 0 | 0 | 0 | 0.5 | O' |
| 1164 | * | 20 | 50 | 30 | 0 | 0 | 0 | 0 | 0 | 0 | 0 | 0.5 | P' |
| 1165 | * | 50 | 10 | 40 | 0 | 0 | 0 | 0 | 0 | 0 | 0 | 0.5 | Q' |
| 1166 | * | 50 | 40 | 10 | 0 | 0 | 0 | 0 | 0 | 0 | 0 | 0.5 | R' |
| 1167 | | 25 | 70 | 5 | 0 | 0 | 0 | 0 | 0 | 0 | 0 | 25 | A' |
| 1168 | | 25 | 0 | 75 | 0 | 0 | 0 | 0 | 0 | 0 | 0 | 25 | B' |
| 1169 | | 44 | 0 | 56 | 0 | 0 | 0 | 0 | 0 | 0 | 0 | 25 | C' |
| 1170 | | 44 | 51 | 5 | 0 | 0 | 0 | 0 | 0 | 0 | 0 | 25 | D' |
| 1171 | | 35 | 15 | 50 | 0 | 0 | 0 | 0 | 0 | 0 | 0 | 25 | M' |
| 1172 | | 40 | 30 | 30 | 0 | 0 | 0 | 0 | 0 | 0 | 0 | 25 | N' |
| 1173 | * | 25 | 70 | 5 | 0 | 0 | 0 | 0 | 0 | 0 | 0 | 30 | A' |
| 1174 | * | 25 | 0 | 75 | 0 | 0 | 0 | 0 | 0 | 0 | 0 | 30 | B' |
| 1175 | * | 44 | 0 | 56 | 0 | 0 | 0 | 0 | 0 | 0 | 0 | 30 | C' |
| 1176 | * | 44 | 51 | 5 | 0 | 0 | 0 | 0 | 0 | 0 | 0 | 30 | D' |
| 1177 | * | 35 | 15 | 50 | 0 | 0 | 0 | 0 | 0 | 0 | 0 | 30 | M' |
| 1178 | * | 40 | 30 | 30 | 0 | 0 | 0 | 0 | 0 | 0 | 0 | 30 | N' |
| 1179 | | 35 | 15 | 50 | 25 | 4 | 3 | 3 | 2 | 2 | 1 | 10 | M' |
| 1180 | | 35 | 15 | 50 | 25 | 0 | 0 | 10 | 0 | 5 | 0 | 10 | M' |
| 1181 | | 35 | 15 | 50 | 10 | 10 | 0 | 0 | 5 | 0 | 0 | 25 | M' |

TABLE 11-continued

| SAMPLE No. | | COMPOSITION OF GLASS (PARTS BY WEIGHT) | | | | | | | | | | | REFERENCE MARKS IN TERNARY PHASE DIAGRAM IN FIG. 3 |
|---|---|---|---|---|---|---|---|---|---|---|---|---|---|
| | | $SiO_2$ | MgO | CaO | $Al_2O_3$ | ZnO | SrO | BaO | $Li_2O$ | $Na_2O$ | $K_2O$ | $B_2O_3$ | |
| 1182 | | 35 | 15 | 50 | 10 | 0 | 10 | 0 | 0 | 0 | 5 | 25 | M' |
| 1183 | | 35 | 15 | 50 | 25 | 0 | 0 | 0 | 0 | 0 | 0 | 25 | M' |
| 1184 | * | 35 | 15 | 50 | 25 | 10 | 0 | 0 | 0 | 0 | 0 | 25 | M' |
| 1185 | * | 35 | 15 | 50 | 0 | 0 | 0 | 0 | 5 | 5 | 5 | 0 | M' |
| 1186 | * | 35 | 15 | 50 | 0 | 10 | 0 | 0 | 0 | 0 | 0 | 0 | M' |
| 1187 | * | 35 | 65 | 0 | 0 | 0 | 0 | 0 | 0 | 0 | 0 | 25 | S' |
| 1188 | | 25 | 45 | 30 | 0.5 | 0 | 0 | 0 | 0 | 0 | 0 | 0 | E' |
| 1189 | | 44 | 22 | 34 | 0.5 | 0 | 0 | 0 | 0 | 0 | 0 | 0 | F' |
| 1190 | | 40 | 19 | 41 | 0.5 | 0 | 0 | 0 | 0 | 0 | 0 | 0 | G' |
| 1191 | | 29 | 40 | 31 | 0.5 | 0 | 0 | 0 | 0 | 0 | 0 | 0 | H' |
| 1192 | | 30 | 19 | 51 | 0.5 | 0 | 0 | 0 | 0 | 0 | 0 | 0 | I' |
| 1193 | | 30 | 5 | 65 | 0.5 | 0 | 0 | 0 | 0 | 0 | 0 | 0 | J' |
| 1194 | | 44 | 5 | 51 | 0.5 | 0 | 0 | 0 | 0 | 0 | 0 | 0 | K' |
| 1195 | | 44 | 19 | 37 | 0.5 | 0 | 0 | 0 | 0 | 0 | 0 | 0 | L |

The principal components of $SiO_2$, MgO and CaO among the compositions of the glasses in respective samples shown in TABLE 7 through TABLE 11 are also described in % by weight units among these components, which are plotted in the ternary phase diagram in FIG. 3. In other words, the reference marks A' to S' are described in the column of "REFERENCE MARKS IN TERNARY PHASE DIAGRAM IN FIG. 3" represent the compositions of the principal components in the glasses according to respective samples, which correspond to the reference marks A' to S' described in FIG. 3.

An organic binder and toluene as a solvent were mixed with each glass powder to prepare a slurry in which the glass powder was uniformly dispersed by thoroughly kneading with a ball mill. The slurry was then defoamed under a reduced pressure.

Respective green sheets with a thickness of 0.2 mm were formed on films from the slurries thus obtained by a casting method using a doctor blade. These green sheets were dried, peeled off from the film and punched to obtain the green sheets having a given dimension.

Molded bodies were obtained by press-molding after laminating a plurality of these green sheets. The molded bodies were sintered at 1000° C. for 2 hours with a heating rate of 200° C. per hour, thereby obtaining sintered crystalline glasses.

Relative dielectric constant, insulation resistance and thermal expansion coefficient were measured while evaluating capability of sintering at a temperature of 1000° C. or less and the nature of crystalline phases.

A sample with a dimension of 10 mm×10 mm×0.5 mm was used for the determination of relative dielectric constant. Electrostatic capacitance was measured with a LCR meter at a frequency of 1 MHZ, a voltage of 1 Vrms and a temperature of 25° C. for calculating relative dielectric constant from the measured electrostatic capacitance.

For the measurement of insulation resistance, the sample with the same dimensions as used in the measurement of the relative dielectric constant was used, on which a direct voltage of 50 V was impressed to measure the resistance at 60 seconds later.

A sample with a dimension of 2 mm×2 mm×10 mm was used, and the mean thermal expansion coefficient in the temperature range of from 30° C. through 400° C. was measured.

The crystalline phase was investigated by X-ray diffraction analysis to identify it by the X-ray diffraction pattern of the surface of the evaluation sample.

The evaluation results as described above are listed in TABLE 12 through TABLE 16.

TABLE 12

| SAMPLE No. | | RELATIVE DIELECTRIC CONSTANT ($\epsilon_r$) | INSULATION RESISTANCE log IR(Ω) | THERMAL EXPANSION COEFFICIENT (ppm/° C.) | CAPABILITY OF SINTERING AT 1000° C. OR LESS | EXISTENCE OF CRYSTALLINE PHASE (YES: ○, NO: X) | | |
|---|---|---|---|---|---|---|---|---|
| | | | | | | MERWINITE | MONTI-CELLITE | CALCIUM SILICATE |
| 1001 | * | — | — | — | NO | — | — | — |
| 1002 | * | — | — | — | NO | — | — | — |
| 1003 | * | — | — | — | NO | — | — | — |
| 1004 | * | — | — | — | NO | — | — | — |
| 1005 | * | — | — | — | NO | — | — | — |
| 1006 | * | — | — | — | NO | — | — | — |
| 1007 | * | — | — | — | NO | — | — | — |
| 1008 | * | — | — | — | NO | — | — | — |
| 1009 | * | — | — | — | NO | — | — | — |
| 1010 | * | — | — | — | NO | — | — | — |
| 1011 | * | — | — | — | NO | — | — | — |
| 1012 | * | — | — | — | NO | — | — | — |

TABLE 12-continued

| SAMPLE No. | | RELATIVE DIELECTRIC CONSTANT ($\epsilon_r$) | INSULATION RESISTANCE log IR(Ω) | THERMAL EXPANSION COEFFICIENT (ppm/°C.) | CAPABILITY OF SINTERING AT 1000° C. OR LESS | EXISTENCE OF CRYSTALLINE PHASE (YES: ○, NO: X) | | |
|---|---|---|---|---|---|---|---|---|
| | | | | | | MERWINITE | MONTI-CELLITE | CALCIUM SILICATE |
| 1013 | * | — | — | — | NO | — | — | — |
| 1014 | * | — | — | — | NO | — | — | — |
| 1015 | * | — | — | — | NO | — | — | — |
| 1016 | * | — | — | — | NO | — | — | — |
| 1017 | * | — | — | — | NO | — | — | — |
| 1018 | * | — | — | — | NO | — | — | — |
| 1019 | | 8.5 | >9 | 12.0 | YES | X | ○ | X |
| 1020 | | 9.0 | >9 | 14.0 | YES | X | X | ○ |
| 1021 | | 7.5 | >9 | 12.5 | YES | X | X | ○ |
| 1022 | | 7.0 | >9 | 11.0 | YES | X | ○ | X |
| 1023 | | 8.0 | >11 | 13.5 | YES | ○ | ○ | ○ |
| 1024 | | 7.5 | >9 | 11.0 | YES | ○ | ○ | X |
| 1025 | * | — | — | — | NO | — | — | — |
| 1026 | * | — | — | — | NO | — | — | — |
| 1027 | * | 6.0 | >9 | 9.0 | YES | X | X | |
| 1028 | * | 6.0 | >9 | 9.5 | YES | X | X | |
| 1029 | | 9.0 | >9 | 11.5 | YES | X | ○ | |
| 1030 | | 9.0 | >9 | 13.5 | YES | X | X | ○ |
| 1031 | | 8.0 | >9 | 12.0 | YES | X | X | ○ |
| 1032 | | 7.5 | >9 | 11.0 | YES | X | ○ | X |
| 1033 | | 8.0 | >11 | 13.0 | YES | ○ | ○ | ○ |
| 1034 | | 8.0 | >9 | 11.5 | YES | ○ | ○ | ○ |
| 1035 | * | — | — | — | NO | — | — | — |
| 1036 | * | — | — | — | NO | — | — | — |
| 1037 | * | — | — | — | NO | — | — | — |
| 1038 | * | — | — | — | NO | — | — | — |
| 1039 | * | — | — | — | NO | — | — | — |
| 1040 | * | — | — | — | NO | — | — | — |

TABLE 13

| SAMPLE No. | | RELATIVE DIELECTRIC CONSTANT ($\epsilon_r$) | INSULATION RESISTANCE log IR(Ω) | THERMAL EXPANSION COEFFICIENT (ppm/°C.) | CAPABILITY OF SINTERING AT 1000° C. OR LESS | EXISTENCE OF CRYSTALLINE PHASE (YES: ○, NO: X) | | |
|---|---|---|---|---|---|---|---|---|
| | | | | | | MERWINITE | MONTI-CELLITE | CALCIUM SILICATE |
| 1041 | | 8.5 | >9 | 12.0 | YES | X | ○ | X |
| 1042 | | 9.0 | >9 | 14.0 | YES | X | X | ○ |
| 1043 | | 7.5 | >9 | 12.5 | YES | X | X | ○ |
| 1044 | | 7.0 | >9 | 11.0 | YES | X | ○ | X |
| 1045 | | 8.0 | >11 | 13.5 | YES | ○ | ○ | ○ |
| 1046 | | 7.5 | >9 | 11.0 | YES | ○ | ○ | X |
| 1047 | | 9.0 | #9 | 11.0 | YES | X | ○ | X |
| 1048 | | 9.5 | #9 | 12.0 | YES | X | X | ○ |
| 1049 | | 8.5 | >9 | 12.0 | YES | X | X | ○ |
| 1050 | | 7.5 | >9 | 11.0 | YES | X | ○ | ○ |
| 1051 | | 8.5 | >11 | 13.0 | YES | ○ | ○ | ○ |
| 1052 | | 8.0 | >9 | 10.5 | YES | ○ | ○ | X |
| 1053 | * | — | — | — | NO | — | — | — |
| 1054 | * | — | — | — | NO | — | — | — |
| 1055 | * | — | — | — | NO | — | — | — |
| 1056 | * | — | — | — | NO | — | — | — |
| 1057 | * | — | — | — | NO | — | — | — |
| 1058 | * | — | — | — | NO | — | — | |
| 1059 | | 8.5 | >9 | 12.0 | YES | X | ○ | X |
| 1060 | | 9.0 | >9 | 14.0 | YES | X | X | ○ |
| 1061 | | 7.5 | >9 | 12.5 | YES | X | X | ○ |
| 1062 | | 7.0 | >9 | 11.0 | YES | X | ○ | X |
| 1063 | | 8.0 | >11 | 13.5 | YES | ○ | ○ | ○ |
| 1064 | | 7.5 | >9 | 11.0 | YES | ○ | ○ | X |
| 1065 | * | — | — | — | NO | — | — | — |
| 1066 | * | — | — | — | NO | — | — | — |
| 1067 | * | 6.0 | >9 | 9.0 | YES | X | X | X |
| 1068 | * | 6.0 | >9 | 9.5 | YES | X | X | X |
| 1069 | | 9.0 | >9 | 12.0 | YES | X | ○ | X |
| 1070 | | 9.0 | >9 | 14.0 | YES | X | X | ○ |
| 1071 | | 7.5 | >9 | 13.0 | YES | X | X | ○ |
| 1072 | | 8.0 | >9 | 11.5 | YES | X | ○ | X |
| 1073 | | 8.0 | >11 | 13.5 | YES | ○ | ○ | ○ |

TABLE 13-continued

| SAMPLE No. | | RELATIVE DIELECTRIC CONSTANT ($\epsilon_r$) | INSULATION RESISTANCE log IR($\Omega$) | THERMAL EXPANSION COEFFICIENT (ppm/°C.) | CAPABILITY OF SINTERING AT 1000° C. OR LESS | EXISTENCE OF CRYSTALLINE PHASE (YES: ○, NO: X) | | |
|---|---|---|---|---|---|---|---|---|
| | | | | | | MERWINITE | MONTI-CELLITE | CALCIUM SILICATE |
| 1074 | | 7.5 | >9 | 11.5 | YES | ○ | ○ | X |
| 1075 | * | — | — | — | NO | — | — | — |
| 1076 | * | — | — | — | NO | — | — | — |
| 1077 | * | — | — | — | NO | — | — | — |
| 1078 | * | — | — | — | NO | — | — | — |
| 1079 | * | — | — | — | NO | — | — | — |
| 1080 | * | — | — | — | NO | — | — | — |

TABLE 14

| SAMPLE No. | | RELATIVE DIELECTRIC CONSTANT ($\epsilon_r$) | INSULATION RESISTANCE log IR($\Omega$) | THERMAL EXPANSION COEFFICIENT (ppm/°C.) | CAPABILITY OF SINTERING AT 1000° C. OR LESS | EXISTENCE OF CRYSTALLINE PHASE (YES: ○, NO: x) | | |
|---|---|---|---|---|---|---|---|---|
| | | | | | | MERWINITE | MONTICELLITE | CALCIUM SILICATE |
| 1081 | | 8.5 | >9 | 12.0 | YES | x | ○ | x |
| 1082 | | 9.0 | >9 | 14.0 | YES | x | x | ○ |
| 1083 | | 7.5 | >9 | 12.5 | YES | x | x | ○ |
| 1084 | | 7.0 | >9 | 11.0 | YES | x | ○ | x |
| 1085 | | 8.0 | >11 | 13.5 | YES | ○ | ○ | ○ |
| 1086 | | 7.5 | >9 | 11.0 | YES | ○ | ○ | x |
| 1087 | | 9.0 | >9 | 12.5 | YES | x | ○ | x |
| 1088 | | 9.5 | >9 | 13.5 | YES | x | x | ○ |
| 1089 | | 8.5 | >9 | 12.5 | YES | x | x | ○ |
| 1090 | | 7.5 | >9 | 11.5 | YES | x | ○ | x |
| 1091 | | 8.5 | >11 | 13.5 | YES | ○ | ○ | ○ |
| 1092 | | 8.0 | >9 | 11.0 | YES | ○ | ○ | x |
| 1093 | * | — | — | — | NO | — | — | — |
| 1094 | * | — | — | — | NO | — | — | — |
| 1095 | * | — | — | — | NO | — | — | — |
| 1096 | * | — | — | — | NO | — | — | — |
| 1097 | * | — | — | — | NO | — | — | — |
| 1098 | * | — | — | — | NO | — | — | — |
| 1099 | | 9.5 | >9 | 12.0 | YES | x | ○ | x |
| 1100 | | 9.0 | >9 | 14.0 | YES | x | x | ○ |
| 1101 | | 7.5 | >9 | 12.5 | YES | x | x | ○ |
| 1102 | | 7.5 | >9 | 11.0 | YES | x | ○ | x |
| 1103 | | 8.0 | >11 | 13.5 | YES | ○ | ○ | ○ |
| 1104 | | 7.5 | >9 | 11.0 | YES | ○ | ○ | x |
| 1105 | * | — | — | — | NO | — | — | — |
| 1106 | * | — | — | — | NO | — | — | — |
| 1107 | * | 6.0 | >9 | 9.0 | YES | x | x | x |
| 1108 | * | 6.0 | >9 | 9.5 | YES | x | x | x |
| 1109 | | 9.5 | >9 | 13.0 | YES | x | ○ | x |
| 1110 | | 9.0 | >9 | 14.0 | YES | x | x | ○ |
| 1111 | | 8.0 | >9 | 14.5 | YES | x | x | ○ |
| 1112 | | 8.0 | >9 | 12.0 | YES | x | ○ | x |
| 1113 | | 8.5 | >11 | 14.0 | YES | ○ | ○ | ○ |
| 1114 | | 8.5 | >9 | 12.0 | YES | ○ | ○ | x |
| 1115 | * | 11.5 | >9 | 13.5 | NO | x | ○ | x |
| 1116 | * | 10.5 | >9 | 14.5 | NO | x | x | ○ |
| 1117 | * | 10.5 | >9 | 14.5 | NO | x | x | ○ |
| 1118 | * | 10.5 | >9 | 13.0 | NO | x | ○ | x |
| 1119 | * | 11.0 | >11 | 14.5 | NO | ○ | ○ | ○ |
| 1120 | * | 11.0 | >9 | 12.5 | NO | ○ | ○ | x |

TABLE 15

| SAMPLE No. | RELATIVE DIELECTRIC CONSTANT ($\epsilon_r$) | INSULATION RESISTANCE log IR($\Omega$) | THERMAL EXPANSION COEFFICIENT (ppm/°C.) | CAPABILITY OF SINTERING AT 1000° C. OR LESS | EXISTENCE OF CRYSTALLINE PHASE (YES: ○, NO: x) | | |
|---|---|---|---|---|---|---|---|
| | | | | | MELWINITE | MONTICELLITE | CALCIUM SILICATE |
| 1121 | 8.5 | >9 | 12.0 | YES | x | ○ | x |
| 1122 | 9.0 | >9 | 14.0 | YES | x | x | ○ |
| 1123 | 8.0 | >9 | 12.5 | YES | x | x | ○ |

TABLE 15-continued

| SAMPLE No. | | RELATIVE DIELECTRIC CONSTANT ($\epsilon_r$) | INSULATION RESISTANCE log IR(Ω) | THERMAL EXPANSION COEFFICIENT (ppm/° C.) | CAPABILITY OF SINTERING AT 1000° C. OR LESS | EXISTENCE OF CRYSTALLINE PHASE (YES: ○, NO: x) | | |
|---|---|---|---|---|---|---|---|---|
| | | | | | | MELWINITE | MONTICELLITE | CALCIUM SILICATE |
| 1124 | | 7.5 | >9 | 11.0 | YES | x | ○ | x |
| 1125 | | 8.0 | >11 | 13.5 | YES | ○ | ○ | ○ |
| 1126 | | 7.5 | >9 | 11.0 | YES | ○ | ○ | x |
| 1127 | | 9.5 | >9 | 13.0 | YES | x | ○ | x |
| 1128 | | 9.0 | >9 | 14.0 | YES | x | x | ○ |
| 1129 | | 8.0 | >9 | 14.5 | YES | x | x | ○ |
| 1130 | | 8.0 | >9 | 12.0 | YES | x | ○ | x |
| 1131 | | 8.0 | >11 | 14.5 | YES | ○ | ○ | ○ |
| 1132 | | 8.5 | >9 | 12.5 | YES | ○ | ○ | x |
| 1133 | * | 11.5 | >9 | 13.5 | YES | x | ○ | x |
| 1134 | * | 11.0 | >9 | 14.5 | YES | x | x | ○ |
| 1135 | * | 10.5 | >9 | 14.5 | YES | x | x | ○ |
| 1136 | * | 11.5 | >9 | 13.5 | YES | x | ○ | x |
| 1137 | * | 11.0 | >11 | 14.0 | YES | ○ | ○ | ○ |
| 1138 | * | 10.5 | >9 | 13.0 | YES | ○ | ○ | x |
| 1139 | | 8.5 | >9 | 12.5 | YES | x | ○ | x |
| 1140 | | 8.5 | >9 | 14.0 | YES | x | x | ○ |
| 1141 | | 7.5 | >9 | 12.5 | YES | x | x | ○ |
| 1142 | | 7.5 | >9 | 11.5 | YES | x | ○ | x |
| 1143 | | 8.0 | >11 | 13.5 | YES | ○ | ○ | ○ |
| 1144 | | 7.5 | >9 | 11.0 | YES | ○ | ○ | x |
| 1145 | | 9.0 | >9 | 13.0 | YES | x | ○ | x |
| 1146 | | 9.5 | >9 | 14.0 | YES | x | x | ○ |
| 1147 | | 8.0 | >9 | 14.5 | YES | x | x | ○ |
| 1148 | | 8.5 | >9 | 12.0 | YES | x | ○ | x |
| 1149 | | 8.5 | >11 | 14.0 | YES | ○ | ○ | ○ |
| 1150 | | 8.5 | >9 | 12.0 | YES | ○ | ○ | x |
| 1151 | * | 11.5 | >9 | 14.5 | YES | x | ○ | x |
| 1152 | * | 11.5 | >9 | 14.5 | YES | x | x | ○ |
| 1153 | * | 10.5 | >9 | 13.5 | YES | x | x | ○ |
| 1154 | * | 10.5 | >9 | 13.0 | YES | x | ○ | x |
| 1155 | * | 11.0 | >11 | 13.5 | YES | ○ | ○ | ○ |
| 1156 | * | 11.0 | >9 | 12.5 | YES | ○ | ○ | x |

TABLE 16

| SAMPLE No. | | DIELECTRIC CONSTANT ($\epsilon_r$) | INSULATION RESISTANCE log IR(Ω) | THERMAL EXPANSION COEFFICIENT (ppm/° C.) | CAPABILITY OF SINTERING AT 1000° C. OR LESS | EXISTENCE OF CRYSTALLINE PHASE (YES: ○, NO: x) | | |
|---|---|---|---|---|---|---|---|---|
| | | | | | | MERWINITE | MONTICELLITE | CALCIUM SILICATE |
| 1157 | | 8.5 | >9 | 12.0 | YES | x | ○ | x |
| 1158 | | 9.0 | >9 | 14.0 | YES | x | x | ○ |
| 1159 | | 7.5 | >9 | 12.5 | YES | x | x | ○ |
| 1160 | | 7.0 | >9 | 11.0 | YES | x | ○ | x |
| 1161 | | 8.0 | >11 | 13.5 | YES | ○ | ○ | ○ |
| 1162 | | 7.5 | >9 | 11.0 | YES | ○ | ○ | x |
| 1163 | * | — | — | — | NO | — | — | — |
| 1164 | * | — | — | — | NO | — | — | — |
| 1165 | * | 6.0 | >9 | 9.0 | YES | x | x | x |
| 1166 | * | 6.0 | >9 | 9.0 | YES | x | x | x |
| 1167 | | 8.0 | >9 | 12.0 | YES | x | ○ | x |
| 1168 | | 8.5 | >9 | 12.5 | YES | x | x | ○ |
| 1169 | | 7.0 | >9 | 12.5 | YES | x | x | ○ |
| 1170 | | 7.0 | >9 | 10.0 | YES | x | ○ | x |
| 1171 | | 7.0 | >11 | 12.0 | YES | ○ | ○ | ○ |
| 1172 | | 7.0 | >9 | 10.0 | YES | ○ | ○ | x |
| 1173 | * | 8.5 | >9 | 9.5 | YES | x | ○ | x |
| 1174 | * | 9.0 | >9 | 9.5 | YES | x | x | ○ |
| 1175 | * | 7.5 | >9 | 9.0 | YES | x | x | ○ |
| 1176 | * | 7.0 | >9 | 8.5 | YES | x | ○ | x |
| 1177 | * | 8.0 | >11 | 8.5 | YES | x | ○ | ○ |
| 1178 | * | 7.5 | >11 | 8.0 | YES | x | ○ | x |
| 1179 | | 9.0 | >9 | 12.5 | YES | ○ | ○ | ○ |
| 1180 | | 9.5 | >11 | 14.0 | YES | ○ | ○ | ○ |
| 1181 | | 8.5 | >11 | 13.5 | YES | ○ | ○ | ○ |
| 1182 | | 8.5 | >11 | 12.5 | YES | ○ | ○ | ○ |
| 1183 | | 8.0 | >11 | 12.5 | YES | ○ | ○ | ○ |

TABLE 16-continued

| SAMPLE No. | DIELECTRIC CONSTANT ($\epsilon_r$) | INSULATION RESISTANCE log IR(Ω) | THERMAL EXPANSION COEFFICIENT (ppm/°C.) | CAPABILITY OF SINTERING AT 1000° C. OR LESS | EXISTENCE OF CRYSTALLINE PHASE (YES: ○, NO: x) | | |
|---|---|---|---|---|---|---|---|
| | | | | | MERWINITE | MONTICELLITE | CALCIUM SILICATE |
| 1184 | * | — | — | — | NO | — | — | — |
| 1185 | * | 11.5 | >9 | 14.5 | YES | ○ | ○ | ○ |
| 1186 | * | — | — | — | NO | — | — | — |
| 1187 | * | 8.0 | >11 | 9.5 | YES | x | x | ○ |
| 1188 | 8.5 | >9 | 13.5 | YES | ○ | ○ | x |
| 1189 | 7.0 | >9 | 12.5 | YES | ○ | ○ | x |
| 1190 | 7.5 | >9 | 12.5 | YES | ○ | ○ | ○ |
| 1191 | 8.0 | >9 | 12.5 | YES | ○ | ○ | x |
| 1192 | 8.0 | >11 | 12.5 | YES | ○ | ○ | ○ |
| 1193 | 8.5 | >11 | 13.0 | YES | ○ | ○ | ○ |
| 1194 | 7.5 | >11 | 13.0 | YES | ○ | ○ | ○ |
| 1195 | 7.5 | >11 | 13.0 | YES | ○ | ○ | ○ |

The reason why the composition range of the crystalline glass composition for use in a circuit board according to the present invention is limited will be described hereinafter with reference to TABLES 7 to 11 and TABLES 12 to 16, and FIG. 3.

The crystalline glass composition for use in a circuit board having the composition within the preferred range of the present invention contains principal components of $SiO_2$, MgO and CaO, while containing sub-components of at least one of (1) $Al_2O_3$, (2) at least one of BaO and SrO, and ZnO, (3) at least one of $Li_2O$, $Na_2O$ and $K_2O$, and (4) $B_2O_3$.

The sample Nos. 1001 to 1018 in TABLE 7 containing no sub-components. These sample Nos. 1001 to 1018 cannot be sufficiently sintered at a temperature of 1000° C. or less as shown in TABLE 12. Although the sample Nos. 1001 to 1014 have composition within the range of the present invention as for the principal components, sintering is impossible since they do not contain any sub-components.

The compositions of $xSiO_2$—$yMgO$—$zCaO$ (x, y and z are represented by % by weight) as a principal component of the glass composition shown in TABLE 7 to TABLE 11 within the range of the present invention fall within the area surrounded by the lines connecting the points A' (25, 70, 5), B' (25, 0, 75), C' (44, 0, 56) and D' (44, 51, 5) in the ternary phase diagram in FIG. 3. In other words, the compositions A', B', C', D', E', F', G', H', I', J', K', L', M' and N' are included within the range of the present invention.

With respect to the compositions of the principal component, the area X' in FIG. 3 that is out of the preferred range of the present invention includes the compositions O' and P', and sample Nos. 1025 and 1026 in TABLE 7, sample Nos. 1065 and 1066 in TABLE 8, sample Nos. 1105 and 1106 in TABLE 9 and sample Nos. 1163 and 1164 in TABLE 11 have these compositions. As shown by sintering properties of the sample Nos. 1025 and 1026 shown in TABLE 12, sample Nos. 1065 and 1066 shown in TABLE 13, sample Nos. 1105 and 1106 shown in TABLE 14, and sample Nos. 1163 and 1164 shown in TABLE 16, these samples are insufficiently sintered at a temperature of 1000° C. or less.

Likewise, with respect to the compositions of the principal components, the composition represented by "S" falls within the area Y' that is out of the preferred range of the present invention. The sample No. 1187 in TABLE 11 has this composition. As is evident from thermal expansion coefficient and features of the deposited crystal of the sample No. 1187 shown in TABLE 16, the thermal expansion coefficient becomes as small as 10 ppm/° C. or less because none of merwinite, monticellite and calcium silicate are deposited.

Likewise, with respect to the compositions of the principal components, the compositions represented by "Q'" and "R'" fall within the area Z' in FIG. 3 that is out of the preferred range of the present invention. The sample Nos. 1027 and 1028 in TABLE 7, sample Nos. 1067 and 1068 in TABLE 8, sample Nos. 1107 and 1108 in TABLE 9 and sample Nos. 1165 and 1166 in TABLE 11 have these compositions. As is evident from thermal expansion coefficients of sample Nos. 1027 and 1028 shown in TABLE 12, sample Nos. 1067 and 1068 shown in TABLE 13, sample Nos. 1107 and 1108 shown in TABLE 14 and sample Nos. 1165 and 1166 shown in TABLE 16, their thermal expansion coefficients are reduced to as small as 10 ppm/° C. or less because diopside ($CaMgSi_2O_4$) and enstatite ($MgSiO_3$) having smaller thermal expansion coefficients than those of forsterite, merwinite, monticellite or calcium silicate serve as principal crystalline phase.

While the crystalline glass composition for use in a circuit board according to the present invention contains at least one of the sub-components of (1) $Al_2O_3$, (2) at least one of BaO and SrO, and ZnO, (3) at least one of $Li_2O$, $Na_2O$ and $K_2O$, and (4) $B_2O_3$ as described above, these sub-components are contained in a proportion of about 0.5 to 50% by weight relative to 100 parts by weight of the principal component, while inevitably containing (1) about 0.5 to 25 parts by weight of $Al_2O_3$, if any, (2) about 0.5 to 10 parts by weight of at least one of BaO and SrO, and ZnO, if any, (3) about 0.5 to 5 parts by weight of at least one of $Li_2O$, $Na_2O$ and $K_2O$, if any, and (4) about 0.5 to 25 parts by weight of $B_2O_3$, if any.

With respect to the lower limit of content of the sub-components, they should be contained in a combined proportion of about 0.5 parts by weight or more relative to 100 parts by weight of the principal component in order to allow their effects to be substantially displayed since the sub-components are used for improving the sintering property of the crystalline glass composition at a temperature of 1000° C. or less.

The upper limit of the content of the sub-components will be described hereinafter.

Notice the samples having the compositions exceeding the range of the upper limit content as described above, irrespective of the composition of the principal component being within the range of the present invention. Then, sintering at a temperature of 1000° C. or less is difficult, as shown in TABLE 12, in sample Nos. 35 to 40 as shown in TABLE 1 because the content of the sub-component (1), $Al_2O_3$, exceeds 25 parts by weight relative to 100 parts by weight of the principal component.

Sintering at a temperature of 1000° C. or less is also difficult in sample Nos. 1053 to 1058, 1075 to 1080, and 1093 to 1098 as shown in TABLE 13 and TABLE 14 because the content of the sub-component (2), one of BaO and SrO, exceeds 10 parts by weight relative to 100 parts by weight of the principal component. Likewise, although the sample No. 1186 contains both of the subcomponents (2), BaO and SrO, as shown in TABLE 11, sintering at a temperature of 1000° C. or less is also difficult as shown in TABLE 16 because the combined amount of ZnO and SrO exceeds 10 parts by weight relative to 100 parts by weight of the principal component.

The sample Nos. 1115 to 1120, 1133 to 1138, and 1151 to 1156 have relative dielectric constants of more than 10 as shown in TABLE 14 and TABLE 15 because the content of the sub-component (3), one of the alkali metal oxides $Li_2O$, $Na_2O$ and $K_2O$, exceeds 5 parts by weight relative to 100 parts by weight of the principal components shown in TABLE 9 and TABLE 10. Likewise, the relative dielectric constants of the sample No. 185 exceeds 10 as shown in TABLE 5 because, although it contains all of $Li_2O$, $Na_2O$ and $K_2O$, the combined amount of them is larger than 5 parts by weight relative to 100 parts by weight of the principal component.

The sample Nos. 1173 to 1178 have thermal expansion coefficients of less than 10 ppm/° C. as shown in TABLE 11 because the content of the sub-component (4), $B_2O_3$, exceeds 25 parts by weight relative to 100 parts by weight of the principal component as shown in TABLE 16.

While the sample No. 1184 contains sub-component (1), $Al_2O_3$, sub-component (2), ZnO, and sub-component (4), $B_2O_3$, as shown in TABLE 11 besides the content of each sub-component relative to 100 parts by weight of the principal component being within the range of the present invention, the combined amount of the sub-components exceed 50 parts by weight. Consequently, sintering at a temperature of 1000° C. or less is difficult in the sample No. 1184 as shown in TABLE 16.

On the contrary, at least one crystalline phase among merwinite ($Ca_3MgSi_2O_8$), monticellite ($CaMgSiO_4$) and calcium silicate (at least one of $CaSiO_3$, $Ca_3Si_2O_7$, $Ca_2SiO_4$ and $Ca_3SiO_5$), which have larger heat-expansion coefficient than forsterite ($Mg_2SiO_4$), is deposited in the sample Nos. 1019 to 1024 and 1029 to 1034 shown in TABLE 7 and TABLE 12, sample Nos. 1041 to 1052, 1059 to 1064 and 1069 to 1074 shown in TABLE 8 and TABLE 13, sample Nos. 1081 to 1092, 1099 to 1104 and 1109 to 1114 shown in TABLE 9 and TABLE 14, sample Nos. 1121 to 1132 and 1139 to 1150 shown in TABLE 10 and TABLE 15, and sample Nos. 1157 to 1162, 1167 to 1172, 1179 to 1183 and 1188 to 1195 shown TABLE 11 and TABLE 16. Accordingly, satisfactory sintering is possible at a temperature of 1000° C. or less to endow the composite material with good characteristics for electrical insulators of the circuit board such as a relative dielectric constant of 10 or less, thermal expansion coefficient of 10 ppm/° C. or more, and insulation resistance (log IR) of more than 9.

The sample Nos. 1020, 2021, 1023, 1030, 1031 and 1033 shown in TABLE 7 and TABLE 12, the sample Nos. 1042, 1043, 1045, 1048, 1049, 1051, 1060, 1061, 1063, 1070, 1071 and 1073 shown in TABLE 8 and TABLE 13, sample Nos. 1082, 1083, 1085, 1088, 1089, 1091, 1100, 1101, 1103, 1110, 1111 and 1113 shown in TABLE 9 and TABLE 14, sample Nos. 1122, 1123, 1125, 1128, 1129, 1131, 1140, 1141, 1143, 1146, 1147 and 1149 shown in TABLE 10 and TABLE 15, and sample Nos. 1158, 1159, 1161, 1168, 1169, 1171, 1179, 1183, and 1188 to 1195 shown in TABLE 11 and TABLE 16 falling within a more restricted area in the area surrounded by the lines connecting the pints A', B' and C' that prescribe the range of the present invention, or falling within the area surrounded by the lines connecting the points E' (25, 45, 30), B' (25, 0, 75), C' (44, 0, 56), F' (44, 22, 34), G' (40, 19, 41) and H' (29, 40, 31) in the ternary phase diagram shown in FIG. 3, have a larger thermal expansion coefficient of 12 ppm/° C.

Merwinite, monticellite and calcium silicate are all deposited in sample Nos. 1023 and 1033 shown in TABLE 7 and TABLE 12, sample Nos. 1045, 1051, 1063 and 1073 shown in TABLE 8 and TABLE 13, sample Nos. 1085, 1091, 1103 and 1113 shown in TABLE 9 and TABLE 14, sample Nos. 1125, 1131, 1143 and 1149 shown in TABLE 10 and TABLE 15, and sample Nos. 1161, 1171, 1179, and 1192 to 1195 shown in TABLE 11 and TABLE 16, which falls within a more restricted area in the area surrounded by the lines connecting the points E', B', C', F', G' and H', or within an area surrounded by the lines connecting the points I' (30, 19, 51), J' (30, 5, 65), K' (44, 5, 51), and L' (44, 19, 37) in the ternary phase diagram, enabling the composite material to obtain a high thermal expansion coefficient of 12 ppm/° C. or more (almost all the composite materials have a thermal expansion coefficient of exceeding 12 ppm/° C.) while enabling the composite material to obtain a high insulating property because the insulation resistance (log IR) exceeds 11.

Even when the composite material contains the principal components with compositions falling within the area surrounded by the lines connecting the points A', D', C' and D' and the sub-components with the compositions within the range of the present invention, it sometimes happens that only crystalline phases other than the specified preferable crystalline phases as described above are deposited in the solid phase obtained by quenching for vitrification as previously described. For example, when the glass compositions according to the sample No. 24 in TABLE 1 is cooled on a metal plate, forsterite is deposited in the quenched solid phase. When the deposited phase is heat-treated, the principal crystalline phase comprises forsterite, diopside and akermanite without depositing desired crystalline phases, and consequently it is confirmed that the thermal expansion coefficient is reduced to 12 ppm/° C. or less. It depends on the production method whether a crystalline glass having a desired crystalline phase is obtained or not, even when the same glass composition has been used.

As is evident from the Examples as hitherto described, a crystalline glass composition for use in a circuit board according to the present invention contains principal components of $SiO_2$, MgO and CaO with compositions falling within an area surrounded by the lines connecting the points A' (25, 70, 5), B' (25, 0, 75), C' (44, 0, 56) and D' (44, 51, 5). The glass composition also contains at least one of sub-components of (1) $Al_2O_3$, (2) at least one BaO and SrO, and ZnO, (3) at least one of $Li_2O$, $Na_2O$ and $K_2O$, and (4) $B_2O_3$. The sub-components are contained in a proportion of about 0.5 to 50 parts by weight of the relative to 100 parts by weight of the principal component, while containing (1) about 0.5 to 25 parts by weight of $Al_2O_3$, if any, (2) about 0.5 to 10 parts by weight of at least one of BaO and SrO and ZnO, if any, (3) about 0.5 to 5 parts by weight of at least one of $Li_2O$, $Na_2O$ and $K_2O$, if any, and (4) about 0.5 to 25 parts by weight of $B_2O_3$, if any. Since at least one crystalline phase among merwinite ($Ca_3MgSi_2O_8$), monticellite ($CaMgSiO_4$) and calcium silicate (at least one of $CaSiO_3$, $Ca_3Si_2O_7$, $Ca_2SiO_4$ and $Ca_3SiO_5$) is deposited by heat-treatment, the glass composition can be sintered at a temperature of 1000° C. or less, endowing the glass composition with favorable characteristics as a electrical insulator for use in circuit board with a relative dielectric constant of as low as 10 or less and a thermal expansion coefficient of as high as 10 ppm/° C. or more.

Various changes and modifications can be made in the products and process of the present invention without departing from the spirit and scope thereof. The various embodiments which have been illustrated in this specification were intended to exemplify the invention but were not intended to limit it.

What is claimed is:

1. A crystalline glass composition for use in a circuit board containing at least one crystalline phase selected from the group consisting of merwinite, monticellite and calcium silicate and comprising $SiO_2$, MgO and CaO in a composition ratio, in % by weight, within an area surrounded by lines connecting the points (25, 70, 5), (25, 0, 75), (44, 0, 56) and (44, 51, 5) on a ternary phase diagram thereof.

2. A crystalline glass composition for use in a circuit board according to claim 1 in which the composition ratio of $SiO_2$, MgO and CaO is an area surrounded by the lines connecting the points A (25, 45, 30), B (25, 0, 75), C (44, 0, 56), D (44, 22, 34), E (40, 19, 41) and F (29, 40, 31) on the ternary phase diagram.

3. A crystalline glass composition for use in a circuit board according to claim 2 containing merwinite, monticellite and calcium silicate.

4. A crystalline glass composition for use in a circuit board according to claim 2 in which the composition ratio of $SiO_2$, MgO and CaO is an area surrounded by the lines connecting the points G (30, 19, 51), H (30, 5, 65), I (44, 5, 51), and J (44, 19, 37) on the ternary phase diagram.

5. A crystalline glass composition for use in a circuit board according to claim 1 in which the $SiO_2$, MgO and CaO is a principal component and the composition contains about 0.5 to 50 parts by weight relative to 100 parts by weight of the principal component of a sub-components which is at least one of (a) $Al_2O_3$, (b) at least one of BaO, SrO, and ZnO, (c) at least one of $Li_2O$, $Na_2O$ and $K_2O$, and (d) $B_2O_3$, wherein the composition ratio of $SiO_2$, MgO and CaO is within an area surrounded by the lines connecting the points A' (25, 70, 5), B' (25, 0, 75), C' (44, 0, 56) and D' (44, 51, 5) on the ternary phase diagram, and when present, (a) is about 0.5 to 25 parts by weight, (b) is about 0.5 to 10 parts by weight, (c) is about 0.5 to 5 parts by weight and (d) is about 0.5 to 25 parts by weight.

6. A crystalline glass composition for use in a circuit board according to claim 5 containing merwinite, monticellite and calcium silicate.

7. A crystalline glass composition for use in a circuit board according to claim 5, wherein the composition ratio of $SiO_2$, MgO and CaO falls within an area surrounded by the lines connecting the points E' (25, 45, 30), B' (25, 0, 75), C' (44, 0, 56), F' (44, 22, 34), G' (40, 19, 41) and H' (29, 40, 31) on the ternary phase diagram.

8. A crystalline glass composition for use in a circuit board according to claim 5, wherein the composition ratio of $SiO_2$, MgO and CaO falls within an area surrounded by the lines connecting the points I' (30, 19, 51), J' (30, 5, 65), K' (44, 5, 51) and L' (44, 19, 37) on the ternary phase diagram.

9. An insulator composition containing a crystalline glass powder comprising the crystalline glass composition for use in a circuit board according to claim 5 and a ceramic powder having a thermal expansion coefficient of about 6.0 ppm/° C. or more.

10. An insulator composition according to claim 9 in which the crystalline glass powder is about 50% by weight or more.

11. An insulator composition according to claim 10 wherein the ceramic powder is at least one ceramic powder selected from a group comprising alumina, forsterite, spinel, quartz, diopside, merwinite, monticellite, steatite, enstatite and calcium silicate.

12. An insulating paste comprising the insulator composition according to claim 9 and an organic vehicle.

13. A thick film circuit board having an insulating layer comprising the fired insulating paste of claim 12.

14. An insulator composition containing a crystalline glass powder comprising the crystalline glass composition for use in a circuit board according to claim 2 and a ceramic powder having a thermal expansion coefficient of about 6.0 ppm/° C. or more.

15. An insulator composition according to claim 14 in which the crystalline glass powder is about 50% by weight or more.

16. An insulator composition according to claim 15 wherein the ceramic powder is at least one ceramic powder selected from a group comprising alumina, forsterite, spinel, quartz, diopside, merwinite, monticellite, steatite, enstatite and calcium silicate.

17. An insulating paste comprising the insulator composition according to claim 14 and an organic vehicle.

18. A thick film circuit board having an insulating layer comprising the fired insulating paste of claim 17.

19. An insulator composition containing a crystalline glass powder comprising the crystalline glass composition for use in a circuit board according to claim 1 and a ceramic powder having a thermal expansion coefficient of about 6.0 ppm/° C. or more.

20. An insulator composition according to claim 19 in which the crystalline glass powder is about 50% by weight or more.

21. An insulator composition according to claim 20 wherein the ceramic powder is at least one ceramic powder selected from a group comprising alumina, forsterite, spinel, quartz, diopside, merwinite, monticellite, steatite, enstatite and calcium silicate.

22. An insulating paste comprising the insulator composition according to claim 19 and an organic vehicle.

23. A thick film circuit board having an insulating layer comprising the fired insulating paste of claim 22.

* * * * *